(12) United States Patent
Vannucci et al.

(10) Patent No.: US 7,419,883 B2
(45) Date of Patent: Sep. 2, 2008

(54) METHOD FOR FABRICATING A SEMICONDUCTOR STRUCTURE HAVING SELECTIVE DOPANT REGIONS

(75) Inventors: Nicola Vannucci, Fuernitz (AT); Sven Lanzerstorfer, Feldkirchen (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 11/466,259

(22) Filed: Aug. 22, 2006

(65) Prior Publication Data
US 2007/0042550 A1 Feb. 22, 2007

(30) Foreign Application Priority Data
Aug. 22, 2005 (DE) .................. 10 2005 039 666

(51) Int. Cl.
*H01L 21/20* (2006.01)
(52) U.S. Cl. ............... 438/390; 438/90; 257/E21.356; 257/E21.363; 257/E21.352
(58) Field of Classification Search .......... 257/E21.352, 257/E21.355, E21.363; 438/91, 38
See application file for complete search history.

(56) References Cited
U.S. PATENT DOCUMENTS

| 5,273,928 A * | 12/1993 | Tani .................. 438/386 |
|---|---|---|
| 5,285,093 A | 2/1994 | Lage et al. |
| 5,462,889 A * | 10/1995 | Tsukada et al. ............. 438/385 |
| 5,701,022 A | 12/1997 | Kellner et al. |
| 5,841,150 A * | 11/1998 | Gonzalez et al. ............... 257/3 |
| 6,054,359 A * | 4/2000 | Tsui et al. .................... 438/385 |
| 6,090,661 A | 7/2000 | Perng et al. |
| 6,107,662 A * | 8/2000 | Kim ........................... 257/330 |
| 6,268,625 B1 | 7/2001 | Lee |
| 7,170,103 B2 * | 1/2007 | Gonzalez et al. ............ 257/104 |
| 7,199,403 B2 * | 4/2007 | Tihanyi ..................... 257/106 |
| 2005/0212086 A1* | 9/2005 | Unterleitner ................ 257/565 |
| 2006/0121684 A1* | 6/2006 | Chen ......................... 438/385 |
| 2007/0145411 A1* | 6/2007 | Chen et al. .................. 257/173 |

FOREIGN PATENT DOCUMENTS
DE 19825524 A1 2/1999

OTHER PUBLICATIONS
Fu, C.Y. "A Novel Borophosphosilicate Glass Process" IEEE 1985 p. 602-605.*

* cited by examiner

Primary Examiner—Walter L. Lindsay, Jr.
Assistant Examiner—Grant S Withers
(74) Attorney, Agent, or Firm—Dicke, Billig & Czaja, PLLC

(57) ABSTRACT

A method for fabricating a semiconductor structure having selective dopant regions in a semiconductor substrate having trenches formed therein I disclosed. In one embodiment, by a dopant source of an auxiliary structure, parts of the semiconductor structure which lie within the trenches are doped by means of a drive-in. In one embodiment, the semiconductor structure is patterned in planar regions outside the trenches and selectively doped by an implantation process.

20 Claims, 21 Drawing Sheets

METHOD FOR FABRICATING A SEMICONDUCTOR STRUCTURE HAVING SELECTIVE DOPANT REGIONS

CROSS-REFERENCE TO RELATED APPLICATIONS

This Utility Patent Application claims priority to German Patent Application No. DE 10 2005 039 666.6 filed on Aug. 22, 2005, which is incorporated herein by reference.

BACKGROUND

The invention relates to a method for fabricating a semiconductor structure having selective dopant regions.

Semiconductor technologies for applications appertaining to automotive, industrial and consumer electronics are distinguished by a multiplicity of semiconductor components for realizing different types of circuit blocks such as, for instance, analog, digital or power circuit blocks and are known as BCD, SPT or else SMART technology.

Some of these semiconductor technologies have only a single polysilicon layer having a specific layer conductivity for realizing components, in order not to drive up the costs of a mask set through additional masks for patterning further polysilicon layers. A polysilicon layer serves for example for forming gate electrode structures, capacitance electrode structures or else diode structures.

A technology with a single polysilicon layer having a specific conductivity entails the disadvantage, however, that it is not possible to form diodes insulated from the substrate and made from polysilicon. However, diodes of this type enable extensive advantages, for instance with regard to the design of charge pumps. With a single polysilicon layer having a specific conductivity it is likewise not possible to realize a broader range of resistances, e.g., resistances insulated from the substrate and made from polysilicon on a small area. However, flexibility with regard to the value of the conductivity and the conductivity type of polysilicon enables further advantages with regard to the match behavior of the threshold voltages of NMOS (n-type metal oxide semiconductor) and PMOS (p-type metal oxide semiconductor) field effect transistors without additional implantations (e.g., channel implantation). An implantation of dopants through a gate electrode structure right into a channel region of a planar MOSFET could likewise be avoided.

For these and other reasons, there is a need for the present invention.

SUMMARY

The invention provides a method for fabricating a semiconductor structure having selective dopant regions in a semiconductor substrate having trenches formed therein. In one embodiment, by means of a dopant source of an auxiliary structure, parts of the semiconductor structure which lie within the trenches are doped by means of a drive-in. The semiconductor structure is patterned in planar regions outside the trenches and selectively doped by an implantation process.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
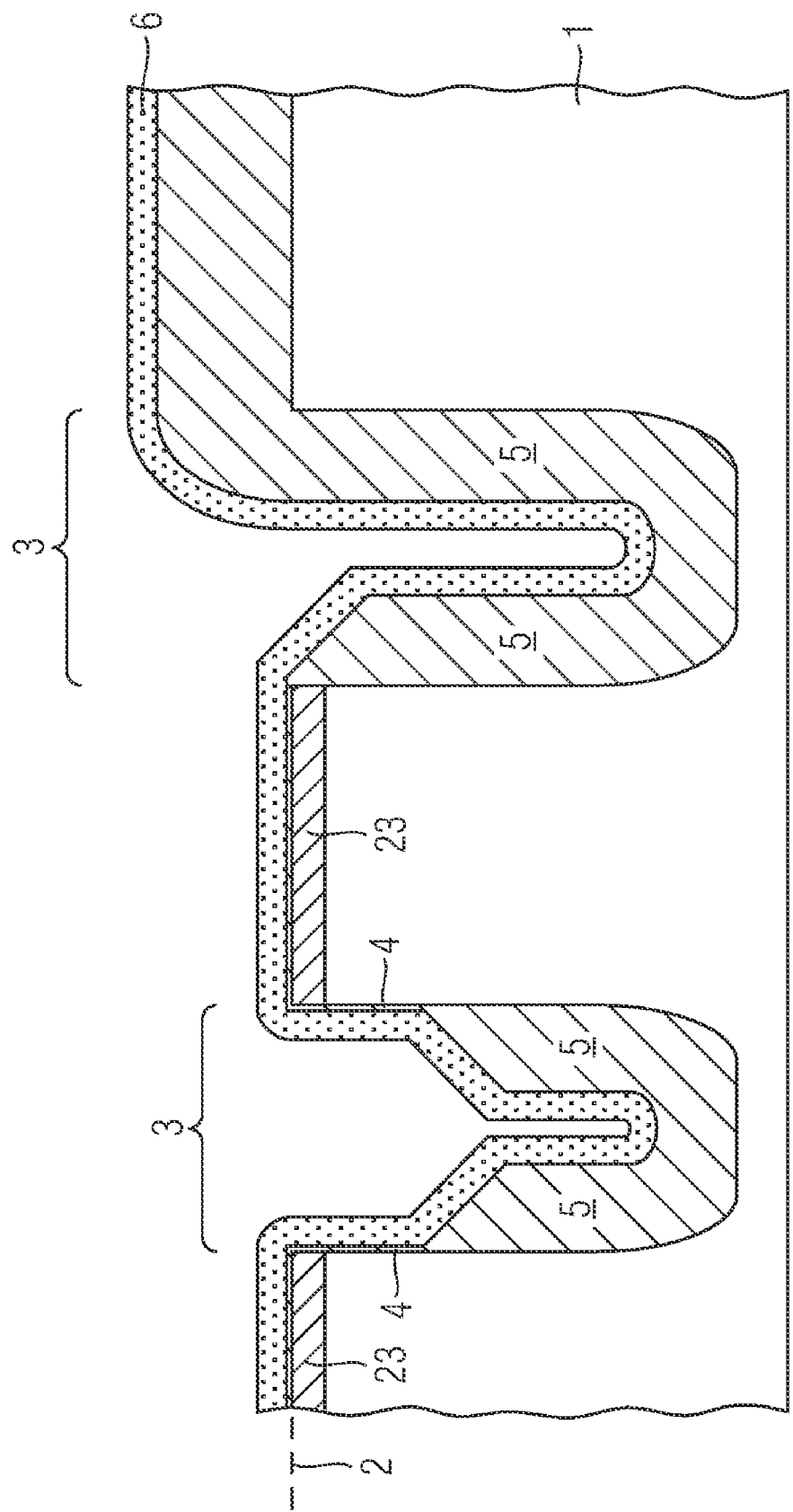
FIGS. 1 to 15 illustrate schematic cross-sectional views of successive process stages during the fabrication of a semiconductor structure in accordance with one embodiment of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a method for fabricating a semiconductor structure having selective dopant regions, such that the disadvantages of a single semiconductor structure such as, for example, a single polysilicon layer having a specific conductivity, can be avoided.

In one embodiment, the invention provides a method for fabricating a semiconductor structure having selective dopant regions, including providing a semiconductor substrate having trenches which are formed therein and reach a semiconductor substrate surface, producing a semiconductor structure covering the semiconductor substrate surface, sidewalls and bottom regions within the trenches, producing an auxiliary structure serving as a dopant source and covering the semiconductor structure, removing at least parts of the auxiliary structure formed above the semiconductor substrate surface, producing a covering structure on uncovered regions of the semiconductor structure and the auxiliary structure, thermally induced introduction of dopants from the auxiliary structure into those parts of the semiconductor structure which are formed within the trenches, removing the covering structure and the auxiliary structure and producing a hard mask structure covering the semiconductor structure, producing a filling structure filling the trenches, producing a resist layer on an uncovered surface and opening parts of the resist layer for patterning the semiconductor structure, removing uncovered regions of the hard mask structure that are not covered by the resist layer, removing the resist layer and uncovered regions of the semiconductor structure that are not covered by the hard mask structure, and introducing dopants of a first conductivity type into first partial regions of the semiconductor structure and dopants of a second conductivity type, which is opposite to the first conductivity type, into second partial regions of the semiconductor structure via an uncovered surface.

In one embodiment, the semiconductor substrate is made of silicon. However, it is likewise conceivable for the semiconductor substrate to be formed from germanium, silicon-germanium or a III-V compound semiconductor such as gallium arsenide. The semiconductor substrate has a gate oxide and field oxide structure within the trenches, by way of example. The covering structure is produced with the smallest possible thermal budget in order not to cause any diffusion of dopants from the auxiliary structure. The latter may be formed for example from an oxide of the silicon such as $SiO_2$ and serves, in particular, as a diffusion barrier for the parts of the auxiliary structure which are now only present in the trenches and serve as a dopant source, so that planar regions of the semiconductor structure which lie outside the trenches are not doped during the diffusion of dopants from the auxiliary structure. A covering layer formed from an oxide of the silicon is one to a few 100 nm thick. The auxiliary structure may be constructed from two or else from a plurality of layers. In one procedure, during the removal of at least parts of the auxiliary structure, a first auxiliary structure remains and subsequently serves temporarily as a protective layer. Thus, by way of example, a first auxiliary structure could be formed from undoped silicate glass and a second structure could be formed from doped silicate glass, after which only the second auxiliary structure is pulled back right into the trenches in order to be able subsequently to dope parts of the semiconductor structure that are arranged there exclusively.

A drive-in is used for introducing the dopants from the auxiliary structure serving as a dopant source into the parts of the semiconductor structure within the trenches. This involves a thermal process by means of which the dopants diffuse from the dopant source into the semiconductor structure. In the case of a PSG (phosphosilicate glass, mixture of $SiO_2$ and $P_2O_5$) as the dopant source and auxiliary structure, the drive-in may be implemented in the temperature range of 900° C. to 1000° C. for 1 minute to a few tens of minutes. Only the parts of the semiconductor structure which lie within the trenches are doped in this case. It should be pointed out that besides PSG, it is likewise possible to use further doping oxides such as, by way of example, $As_2O_3$ or else $Sb_2O_3$ for doping with dopants of the n conductivity type. It is likewise conceivable to provide a doping oxide such as $B_2O_3$ in the auxiliary structure in order to use a corresponding doping with dopants of the p conductivity type or else further solid sources suitable therefor.

In order to remove the covering structure after the drive-in, use is made of a wet-chemical etching process, for example dilute hydrofluoric acid for removing a covering structure having $SiO_2$. By way of example, an ISO-TEOS (isolation tetraethyl orthosilane) is suitable as a hard mask structure, and may have, for instance, a thickness within the range of a few tens to a few hundreds of nm. A hard mask structure is suitable in particular as an implantation protective layer for protecting channel regions in the semiconductor substrate from implantation through a gate electrode structure.

By way of example, polysilicon or else further materials which have an etching selectivity with respect to the hard mask structure is or are suitable as a filling structure. In order that the filling structure is filled only as far as an uncovered surface, this may firstly be produced in a manner also covering the above the uncovered hard mask structure and be removed again in a subsequent etching-back process as far as the hard mask structure and thus as far as a top side of the trenches.

The resist layer that is thereupon applied serves for patterning the semiconductor structure. This may involve a semiconductor structure patterning process that is inherently present in the process sequence of the respective technology, such as a polysilicon patterning process, by way of example, and the corresponding mask is modified according to the invention to the effect that further regions of the semiconductor structure with the aid of which for example diodes or else resistors are intended to be formed are available after the patterning for the definition of corresponding components.

If the semiconductor structure, in the known process sequence of a technology, has hitherto been utilized for example only for forming a gate electrode structure, this may serve also for forming further components by definition of further remaining regions of the semiconductor structure.

After the resist patterning by means of opening parts of the resist layer, the regions of the hard mask structure which are uncovered in this case, that is to say not covered by the resist layer, are removed. After the removal of the residual resist layer, the hard mask structure then serves as an etching stop layer during subsequent etching of the semiconductor structure. After this patterning of the semiconductor structure, the latter thus remains only in those regions in which it is covered by the etching stop layer and is subsequently intended to be utilized for instance as gate electrode structures or for the definition of further components.

Dopants of the first conductivity type are introduced into the first partial regions by a dopant stop layer inherently provided in the process sequence, for instance an implantation mask for source/drain areas, which is correspondingly modified for the doping of the first partial regions. The same applies to the introduction of the dopants of the second conductivity type into the second partial regions of the semiconductor structure.

The first conductivity type may be an n type and the second conductivity type may be a p type. It is likewise conceivable for the first conductivity type to be a p type and for the second conductivity type to be formed as an n type.

In one embodiment of the invention, the semiconductor structure is formed from undoped polysilicon. The semiconductor structure may be, in particular, a semiconductor structure for a gate electrode that is inherently provided in the process sequence.

In a further embodiment, dopants of the first conductivity type are introduced into at least the first partial regions of the semiconductor structure by means of one or more dopant implantation process, the dopant implantation processes being provided for forming well zones of the first conductivity type in an active area of the semiconductor substrate. Likewise, dopants of the second conductivity type are introduced into at least the second regions of the semiconductor structure by one or more further dopant implantation process, the further dopant implantation processes being provided for forming well zones of the second conductivity type in active areas of the semiconductor substrate. The further dopant implantation process is or are implantation processes inherently present in the process and serving for forming, for instance, source or drain areas of n-channel or else p-channel MOSFETs. It is likewise possible for a plurality of these dopant implantation process to be formed, which lead for example to locally different dopant concentrations in the semiconductor structure. As a result, it is possible to form resistors having different layer conductivities and also diodes having different breakdown voltages. The masks assigned to the dopant implantation process or to the formation of well zones linked therewith take account of the corresponding partial regions of the semiconductor structure and are modified correspondingly, so that the first and second partial regions are doped during the implantation process. Consequently, in this embodiment, use is made of implantations present in the process for the doping of corresponding parts of the semiconductor structure, which has a particularly favorable effect with regard to the provision of the semiconductor structure that can be used diversely, especially as there is no need for any new masks to be written.

In a further embodiment, parts of the first partial regions are formed in a manner overlapping parts of the second partial regions. If, by way of example, the first partial regions are formed with a lower maximum dopant concentration than the second partial regions, then the mutually overlapping regions have the conductivity type of the second partial region. Consequently, the dopants of the first conductivity type are overcompensated by the dopants of the second conductivity type and a pn junction arises.

In a further embodiment, mutually adjoining and/or mutually overlapping first and second partial regions are provided for forming diodes. The pn junction of the diodes is again found in the corresponding boundary region in the case of mutually adjoining partial regions. In the case of mutually overlapping first and second partial regions, the pn junction lies in the edge region of the overlapping partial regions.

In a further embodiment, a first partial region and a second partial region of the semiconductor structure, which are remote from one another by virtue of an intervening undoped region of the semiconductor structure, are provided for forming diodes having a breakdown voltage of greater than 10 V. Since the first partial region and the second partial region serve as anode and cathode areas, the undoped region lying in between is depleted of free charge carriers when a reverse voltage is applied. This results in the high breakdown voltage, such a diode type also being referred to as a PIN diode.

In a further embodiment, within the first and/or second partial regions, areas having different dopant concentrations are formed in order to form resistors having different layer conductivities and/or diodes having different breakdown voltages. In this case, the different dopant concentrations are introduced in the respective areas by means of different dopant implantation processes, which differ from one another for example with regard to the implantation dose. In order not to cause any additional mask costs, in this case use is made of masks which are inherently present in the process sequence and are utilized for instance for forming source or drain areas. The more masks are present for implantation processes for forming different wells, the more diversely the semiconductor structure can be configured depending on the process sequence plan for instance with regard to different types of layer conductivities of resistors or else breakdown voltages of diodes.

In one embodiment, the auxiliary structure has a plurality of auxiliary structures arranged one above another. The plurality of auxiliary structures may be stacked one above another, by way of example. It is to use a first auxiliary structure as a dopant barrier structure of a second auxiliary structure that is subsequently produced and serves as a dopant source. It is thus possible to prevent a situation where, caused by the thermal budget, during the deposition of the second auxiliary structure serving as a dopant source, dopants pass therefrom into such regions of the semiconductor structure which are intended to remain undoped.

In one embodiment, in order to form the auxiliary structure, firstly a first auxiliary structure having an undoped oxide of the silicon is formed and a second auxiliary structure having a mixture of an oxide of the silicon and an oxide of a dopant element is formed on the first auxiliary structure. By way of example, an undoped silicate glass ($SiO_2$) serves as the first auxiliary structure and a mixture of a silicate glass and an oxide of a dopant element serves as the second auxiliary structure. As the oxide of a dopant element, by way of example, $P_2O_5$ may be used for doping with phosphorus (i.e. second auxiliary structure made from PSG), $B_2O_3$ may be used for doping with boron, $As_2O_3$ may be used for doping with arsenic or else $Sb_2O_3$ may be used for doping with antimony.

In one embodiment, the second auxiliary structure is produced in the temperature range of 300° C. to 950° C. The second auxiliary structure is fabricated with the lowest possible thermal budget, that is to say low production temperature and production duration. This prevents the thermal budget from already leading to a doping of the semiconductor structure during the fabrication of the second auxiliary structure.

FIG. 1 illustrates a schematic cross-sectional view at the beginning of a sequence according to one embodiment of the invention of a method for fabricating a semiconductor structure having selective dopant regions. In one embodiment, a preprocessed semiconductor substrate 1 made of silicon is provided, into which trenches 3 reach into the semiconductor substrate 1 from a semiconductor substrate surface 2. Within the trenches 3, a gate oxide structure 4 and also a field oxide structure 5 are formed in a manner adjoining the semiconductor substrate 1 via sidewalls and a bottom region. The trench illustrated in the left-hand region is a trench of a transistor cell array, having a gate oxide structure 4 in the upper region of the trench. A field oxide structure 5 is formed in the lower region of the trench and also in the further trench illustrated in the right-hand part of FIG. 1 and serving for an edge termination. Consequently, field oxide structure 5 and gate oxide structure 4 merge with one another in the trench 3 in the left-hand part of FIG. 1.

The first process of the embodiment of the invention involves applying a semiconductor structure 6 made of undoped polysilicon having a thickness within the range of 200 to 350 nm, the semiconductor structure covering the semiconductor substrate surface 2 and also sidewalls and bottom regions within the trenches 3.

Figure 2:
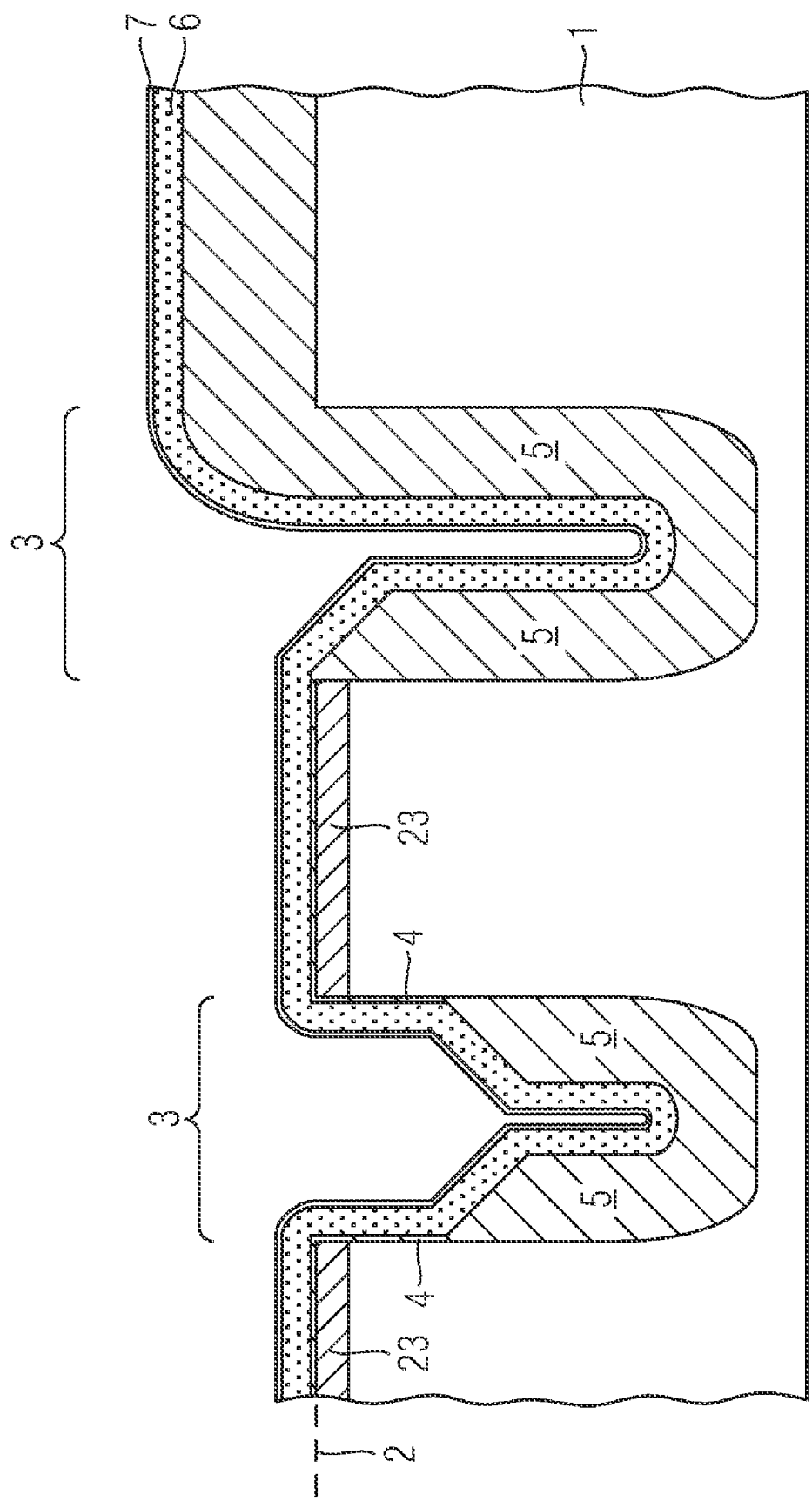

Afterward, as illustrated in the cross-sectional view illustrated schematically in FIG. 2, a first auxiliary structure 7 made of undoped silicate glass, which represents a first part of a double-layered auxiliary structure, is applied to the semiconductor structure with a layer thickness in the range of 50 to 150 nm.

Figure 3:
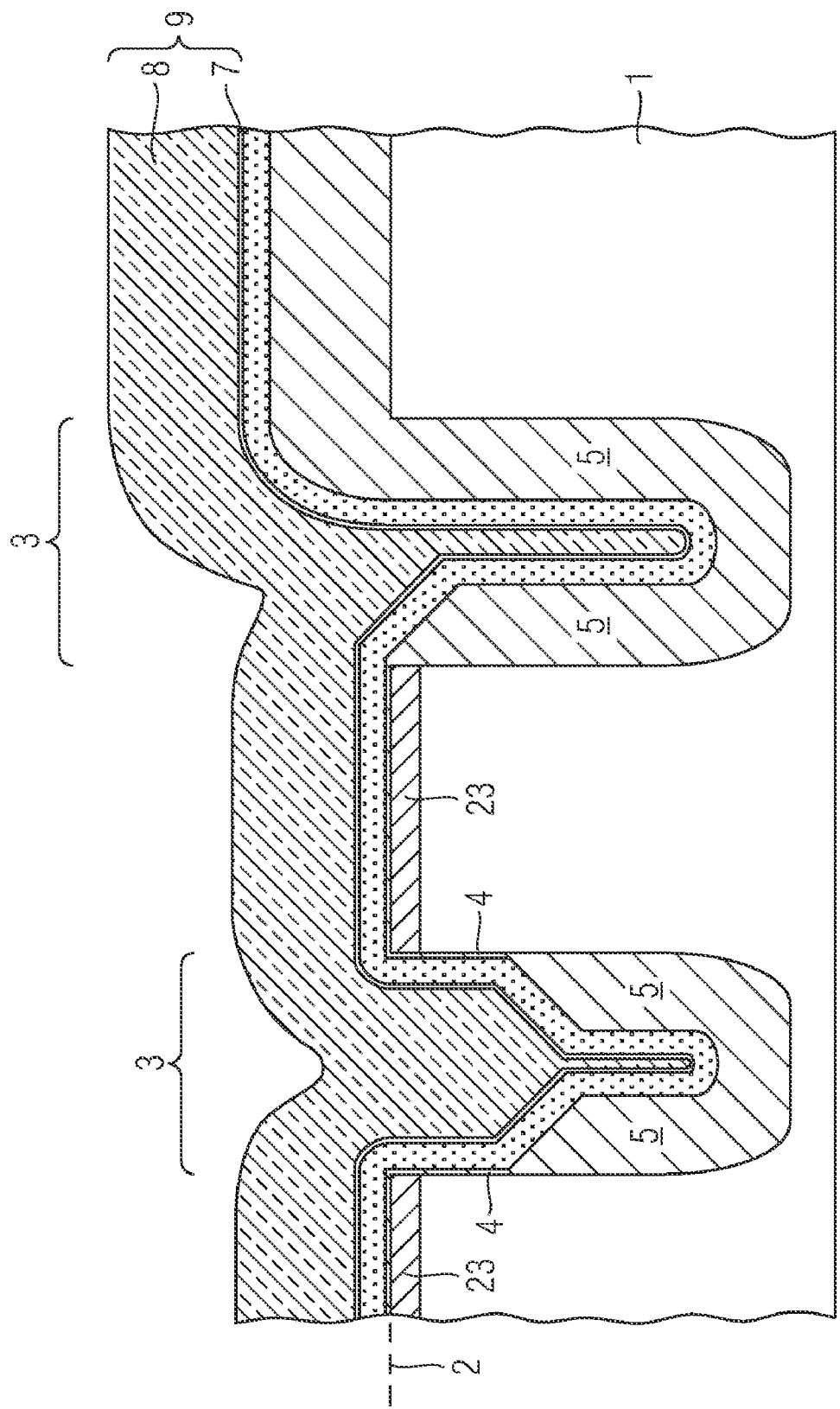

In the schematic cross-sectional view in FIG. 3, after the process stage illustrated in FIG. 2, a second auxiliary structure 8 constructed from phosphosilicate glass (PSG) was applied to the first auxiliary structure 7 and completes the auxiliary structure 9 constructed from the first and second auxiliary structures 7, 8.

Figure 4:
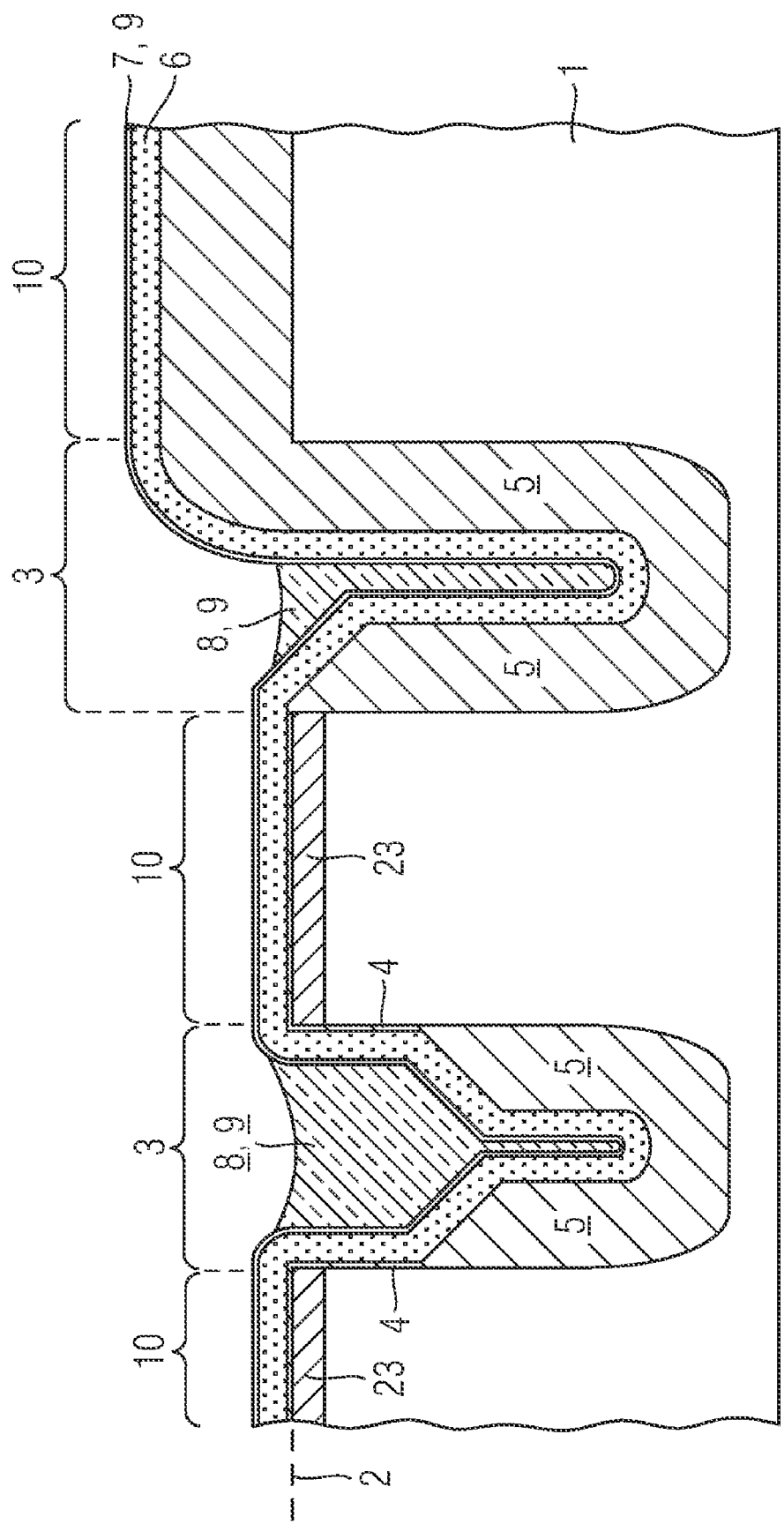

In the subsequent process stage and in the corresponding cross-sectional view illustrated in FIG. 4, that part of the second auxiliary structure 8 which lies above the semiconductor substrate surface 2 was removed. Consequently, the second auxiliary structure made of phosphosilicate glass and serving as a dopant source remains only within the trenches. In planar regions 10 outside the trenches 3, only the first auxiliary structure 7 remains above the semiconductor structure 6 formed from polysilicon.

Figure 5:
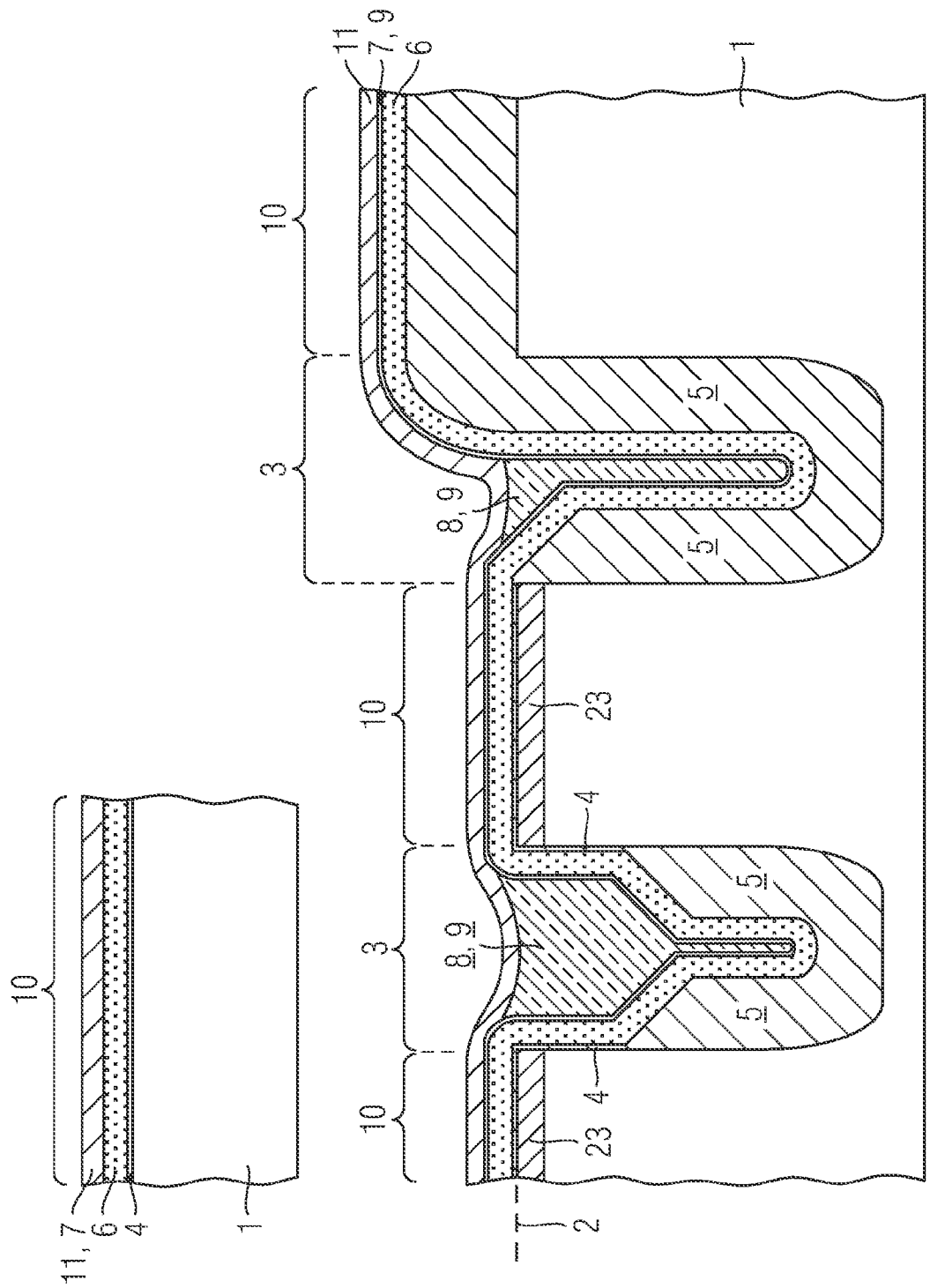

In the cross-sectional view of a subsequent process stage as illustrated in FIG. 5, a covering layer 11 made of silicon dioxide has been applied on uncovered regions of both the first and the second auxiliary structure 7, 8 with a thickness within the range of 250 to 350 nm. The top left partial illustration of FIG. 5 illustrates a schematic cross-sectional view in a further region of the semiconductor substrate 1 that serves for forming a planar MOSFET. The covering structure 11 serves, in particular, as a diffusion barrier in the case of an outdiffusion of phosphorus from the second auxiliary structure 8. The covering structure 11 prevents phosphorus in the planar regions 10 from passing into the semiconductor structure 6 and doping the latter. For driving the phosphorus into those parts of the semiconductor structure 6 which lie within the trenches 3, a drive-in is carried out at a temperature within the range of 900° to 1000° for a duration within the range of 10 to 30 min. Those parts of the semiconductor structure 6 made of polysilicon which lie in the planar region 10 remain undoped in this case on account of the covering structure 11.

Figure 6:
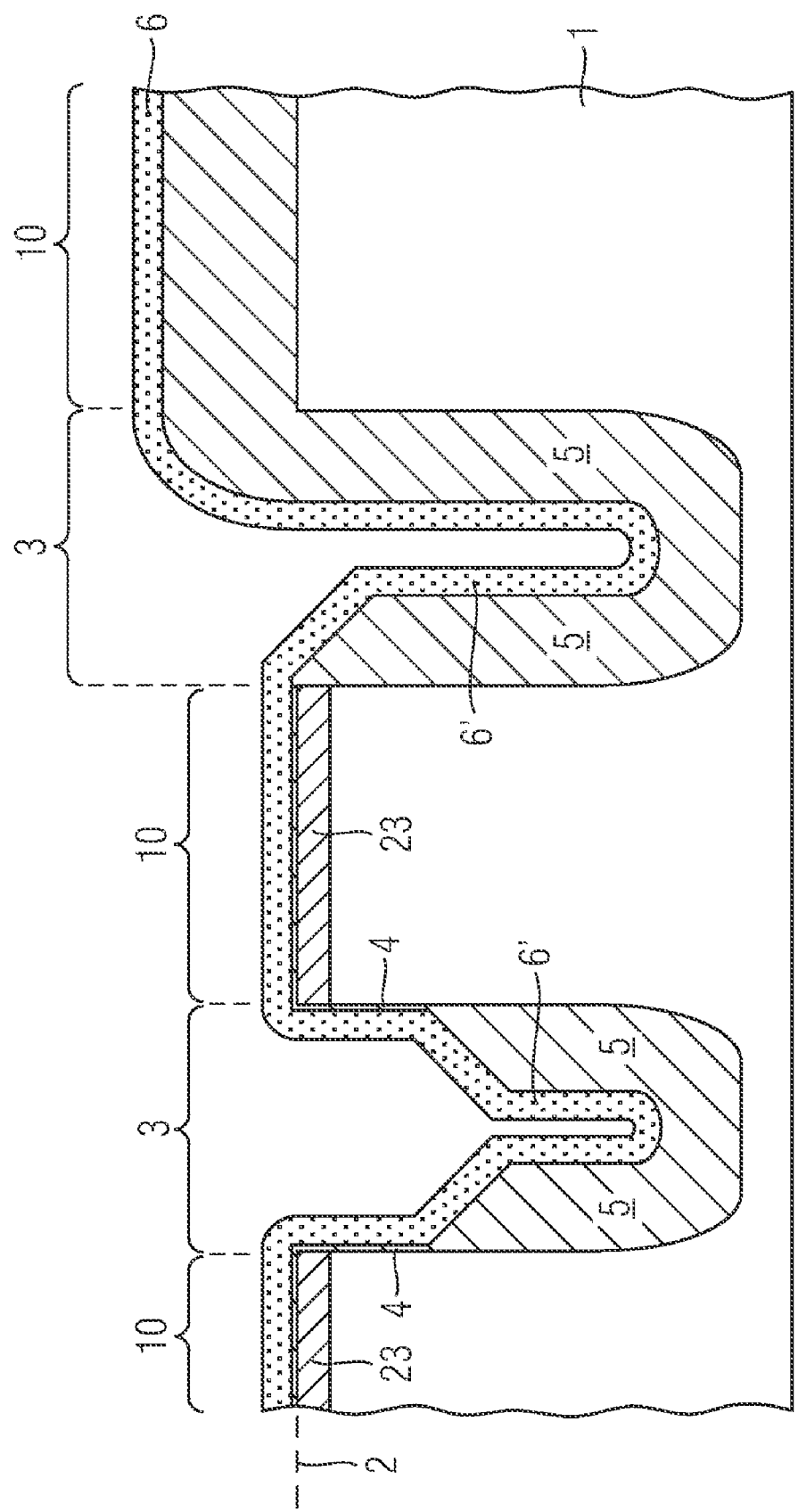

The drive-in is followed by the removal of the covering structure 11 and the auxiliary structure 9, as illustrated in the schematic cross-sectional view in FIG. 6, so that the semiconductor structure 6 is uncovered in the planar regions 10 and also within the trenches 3. It should again be pointed out at this juncture that only those regions of the semiconductor structure 6 which lie within the trenches 3 are doped with phosphorus. Reference is made to this in the figures in a simplifying manner by means of a reference symbol 6' identifying the semiconductor structure 6 within the trenches 3.

Figure 7:
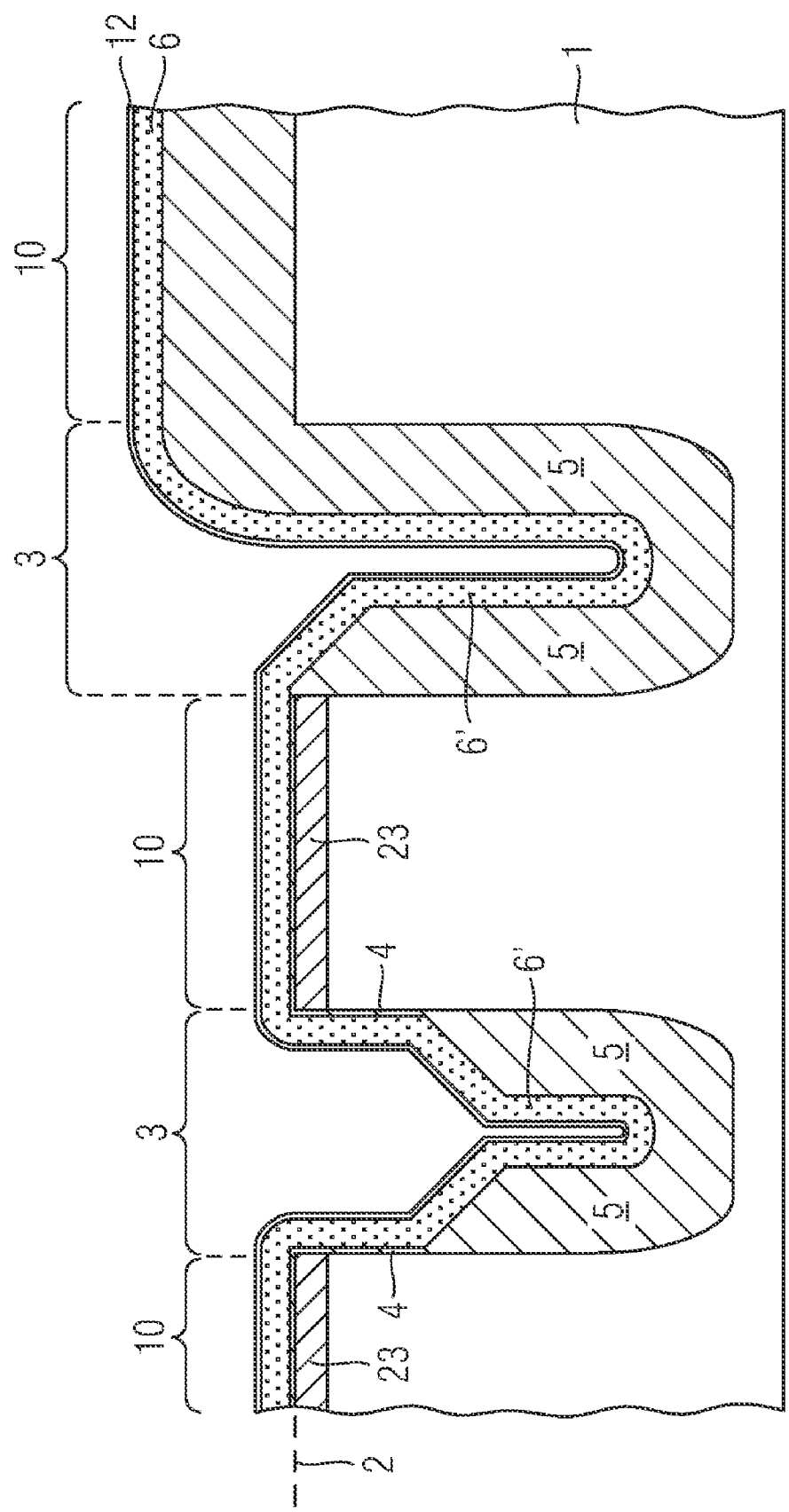

In the schematic cross-sectional view—illustrated in FIG. 7—of a process stage subsequent to the cross-sectional view from FIG. 6, a hard mask structure 12 made of ISO-TEOS (Isolation Tetraethyl Orthosilane) was applied to the uncovered semiconductor structure 6 with a layer thickness within the range of 50 to 150 nm.

Figure 8:
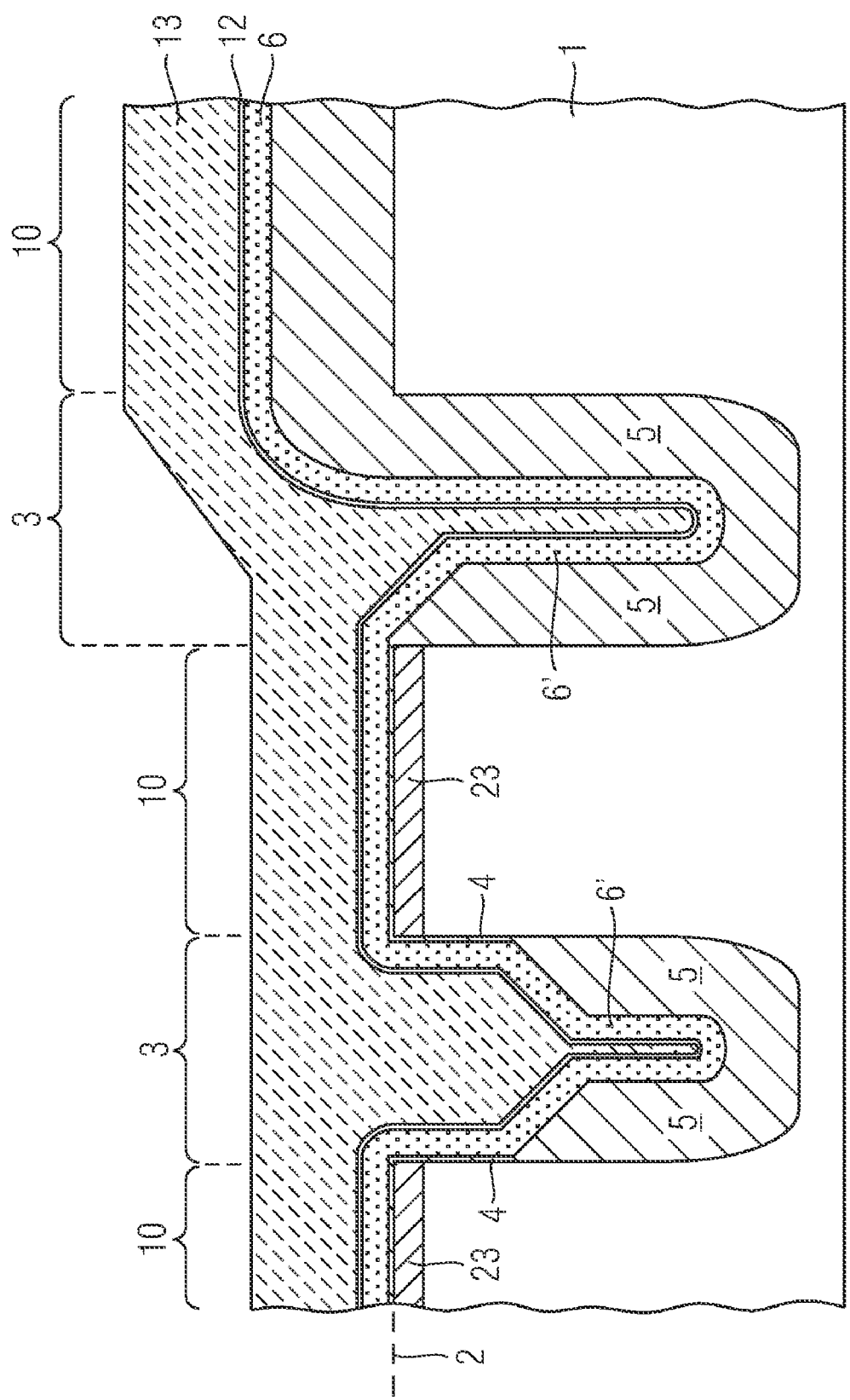

In the process stage illustrated as a cross-sectional view in FIG. 8, a filling structure 13 made of polysilicon is applied to the hard mask structure 12 and this fills the trenches 3, on the one hand, but on the other hand areally covers the planar regions 10.

Figure 9:
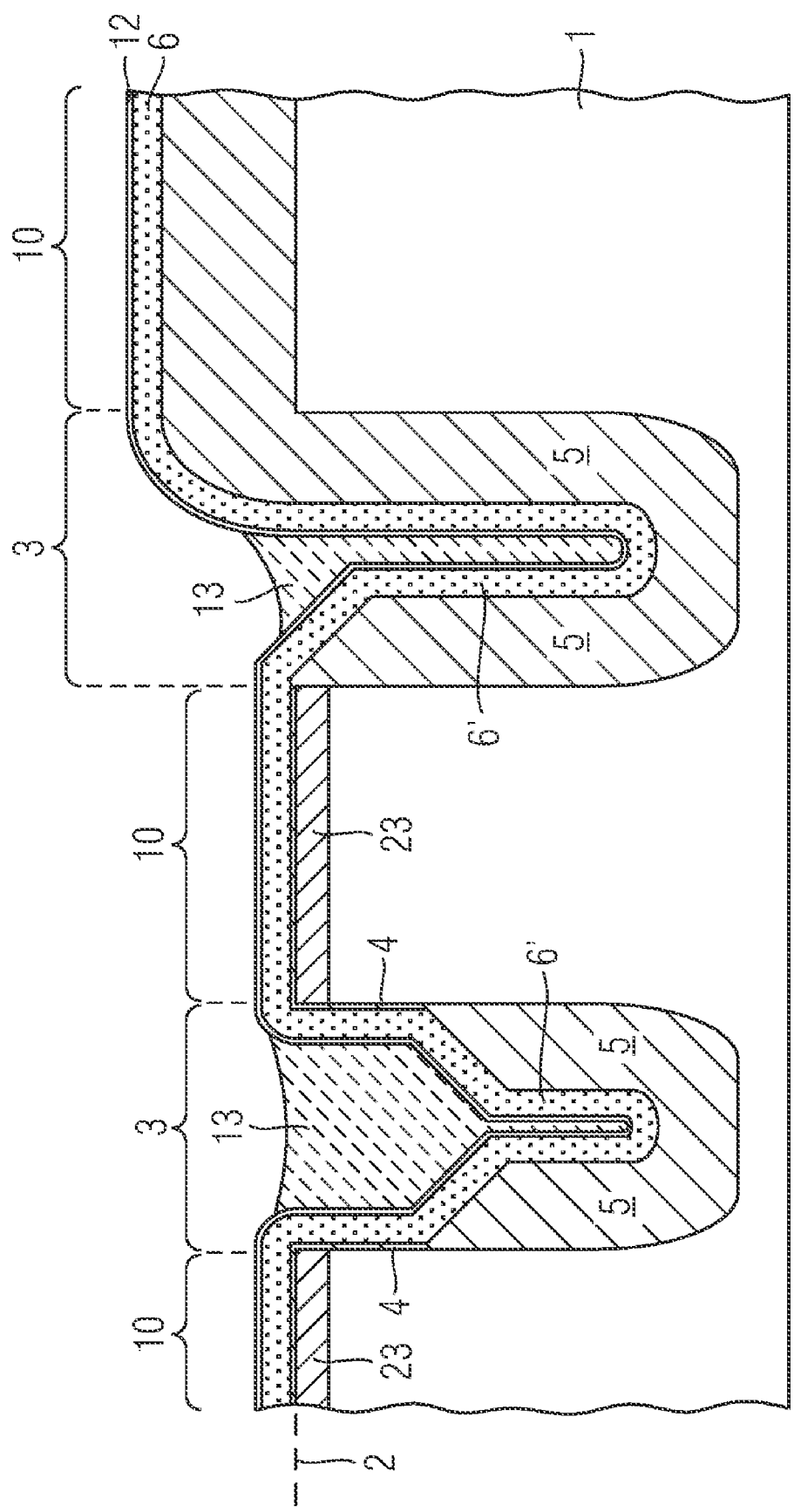

The filling structure 13 is subsequently etched back as far as the hard mask structure 12, as illustrated in the schematic cross-sectional view in FIG. 9. Consequently, this now only fills the trenches 3.

Figure 10:
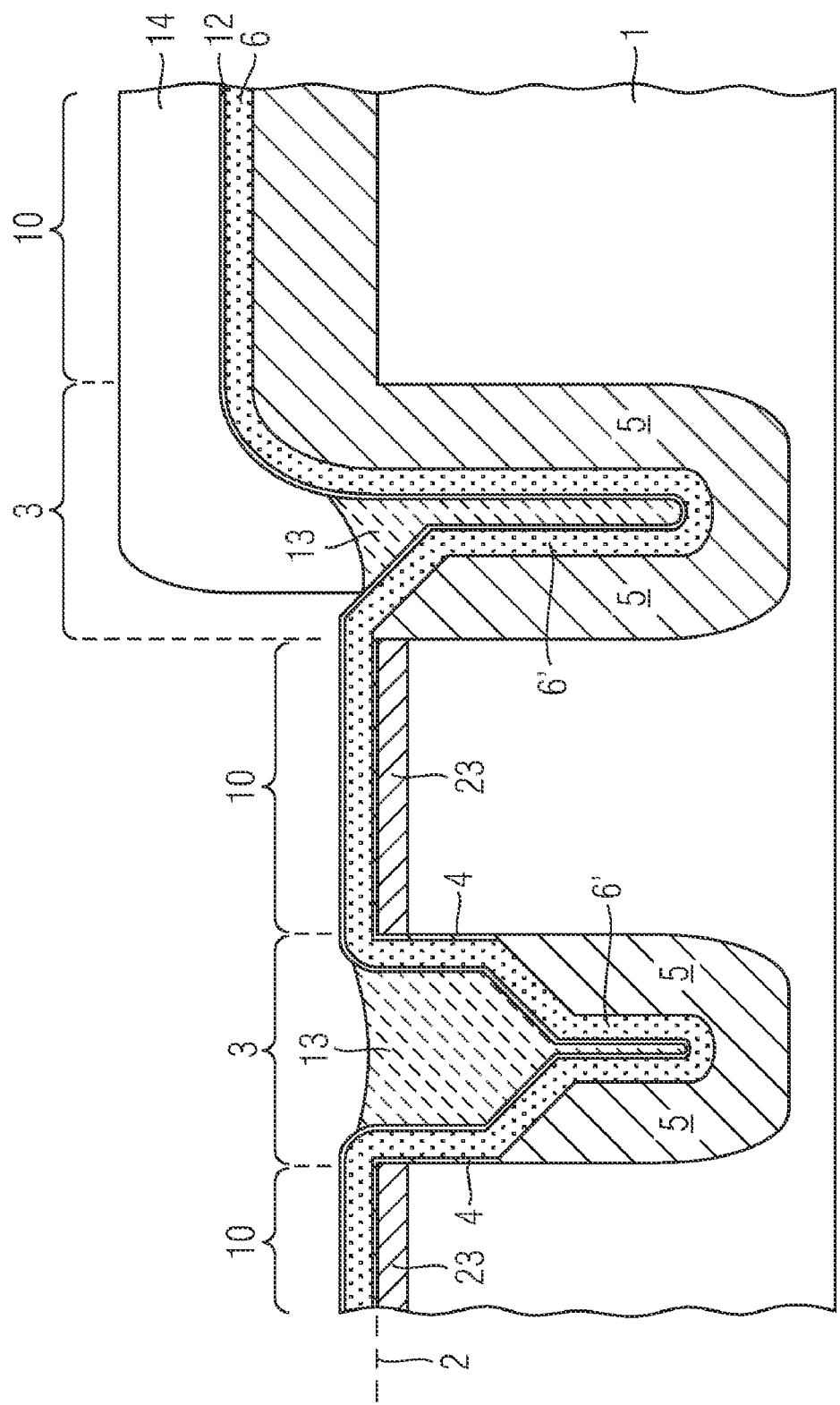

In the schematic cross-sectional view illustrated in FIG. 10, a patterned resist layer 14 is applied to parts of the uncovered surface. The resist layer 14 serves for patterning the semiconductor structure 6 made of polysilicon. A mask inherently present in the process sequence for the patterning of a gate electrode is used for this purpose, especially as the semiconductor structure 6 made of polysilicon may be provided for example for forming gate electrodes in the process sequence.

Figure 11:
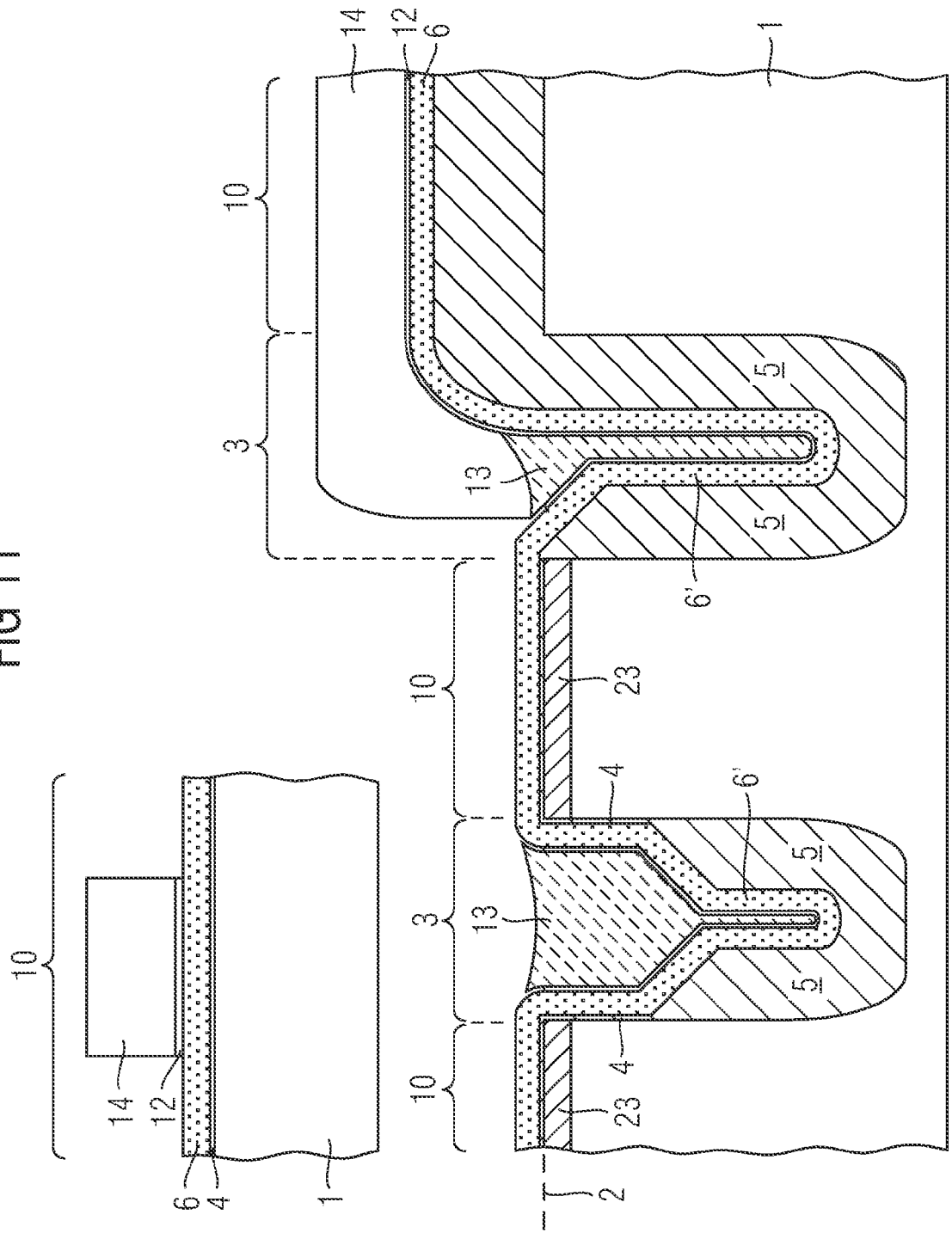

FIG. 11 illustrates a schematic cross-sectional view wherein the parts of the hard mask structure 12 that had been uncovered by means of the resist layer 14 were removed. The partial illustration in the top left region of FIG. 11 illustrates a further schematic cross-sectional view of a planar MOSFET to be formed. In this case, the resist layer 14 covers that region of the MOSFET in which the gate electrode structure is subsequently to be formed.

Figure 12:
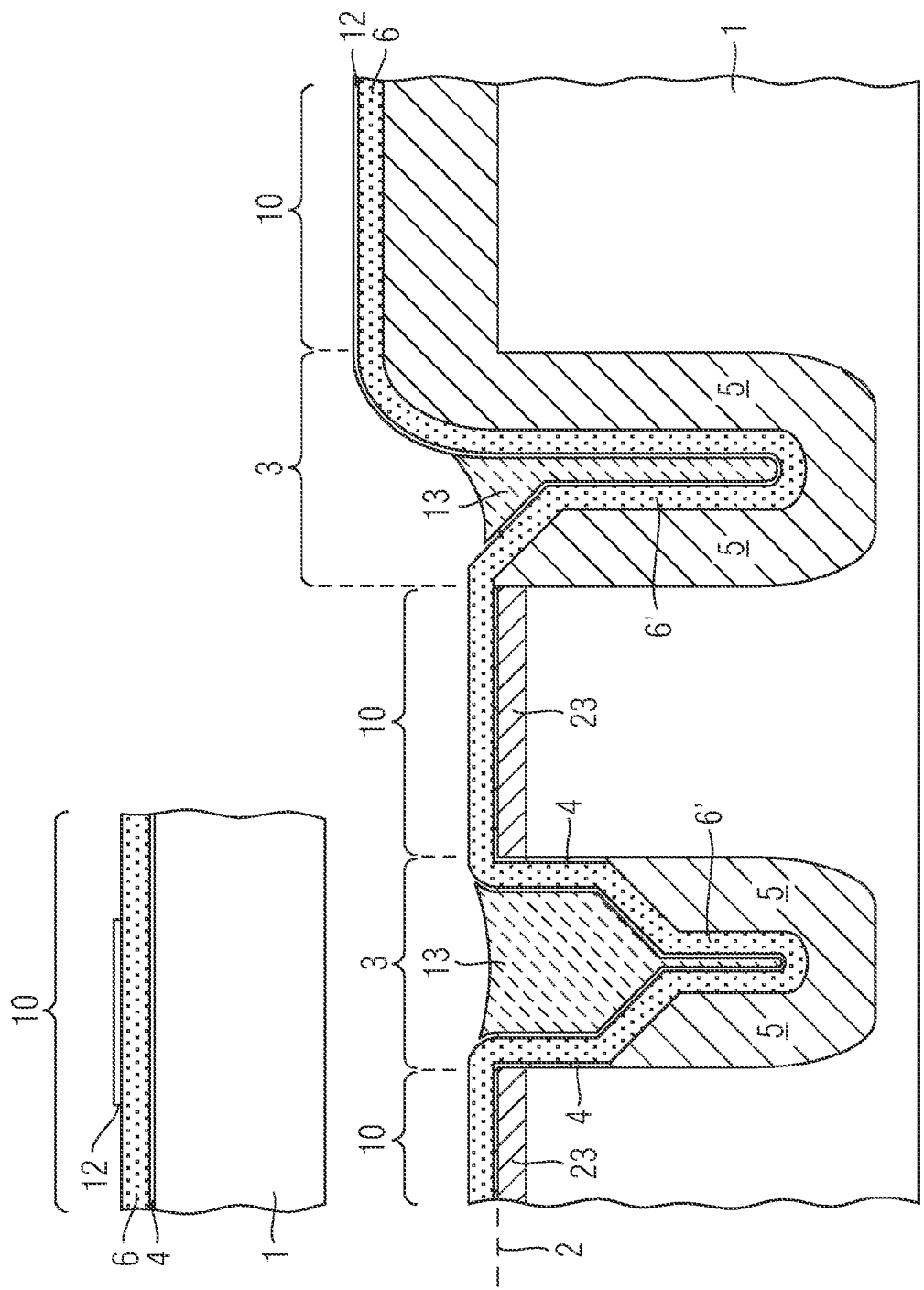

In the process stage in FIG. 12 subsequent to the process stage illustrated in FIG. 11, the resist layer 14 was removed. Consequently, the hard mask structure 12 is only formed above those regions of the semiconductor structure 6 which are also intended to be retained in subsequent process and serve for instance for forming components.

Figure 13:
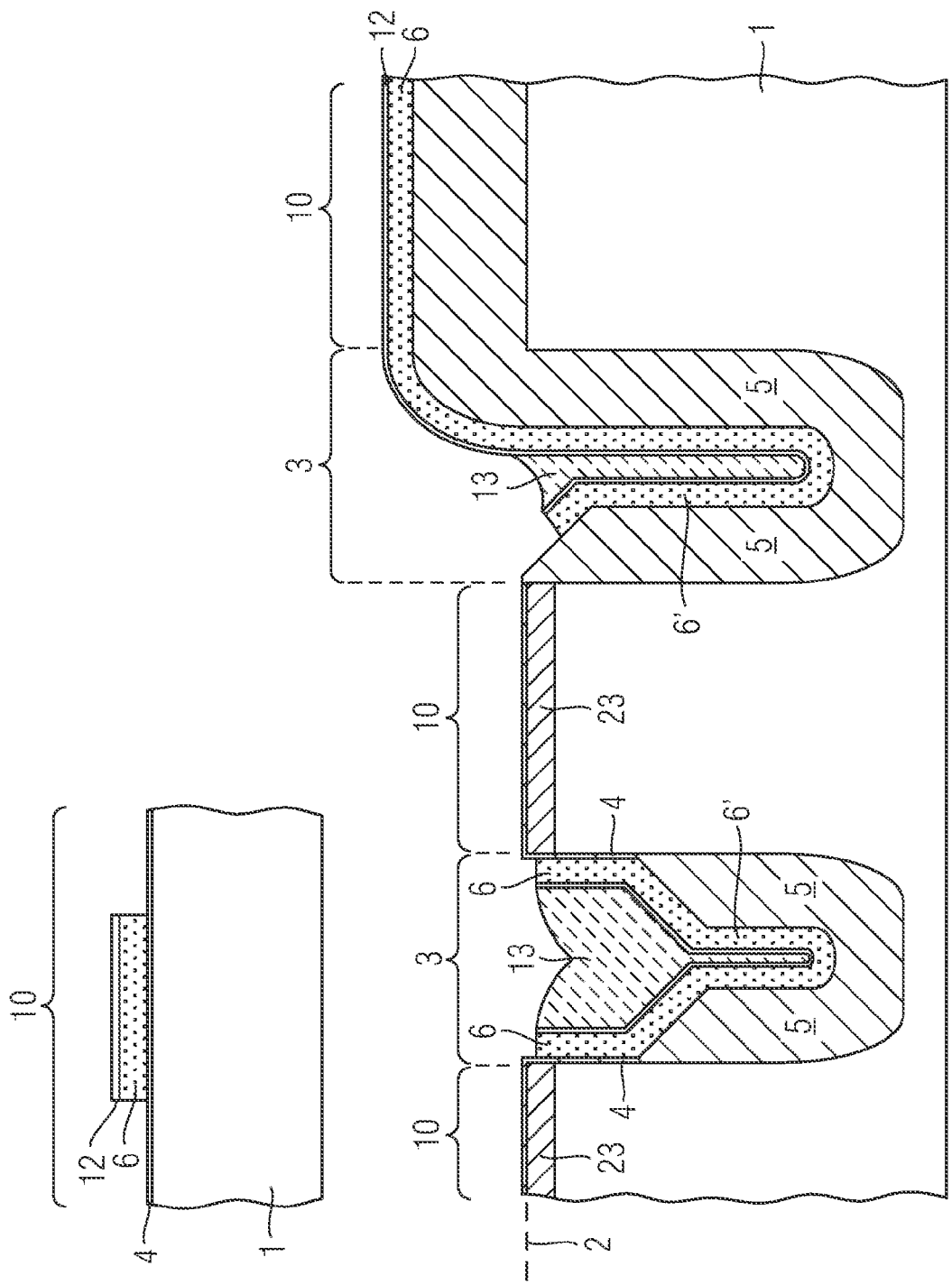

In the schematic cross-sectional view in FIG. 13, the semiconductor structure 6 made of polysilicon was removed in the regions not protected by the hard mask structure 12. Consequently, the semiconductor structure 6 is retained firstly as an electrode within the trenches 3 and also as a field plate outside the trenches 3 in the planar region 10 of the edge termination. The semiconductor structure 6 is removed in a mesa area between the trenches since, by way of example, source areas of a trench transistor are subsequently to be implanted in these regions.

Only a part of the semiconductor structure 6 made of polysilicon which serves as a gate electrode of the planar MOSFET is retained in the partial figure in the top left region in FIG. 13.

Figure 14:
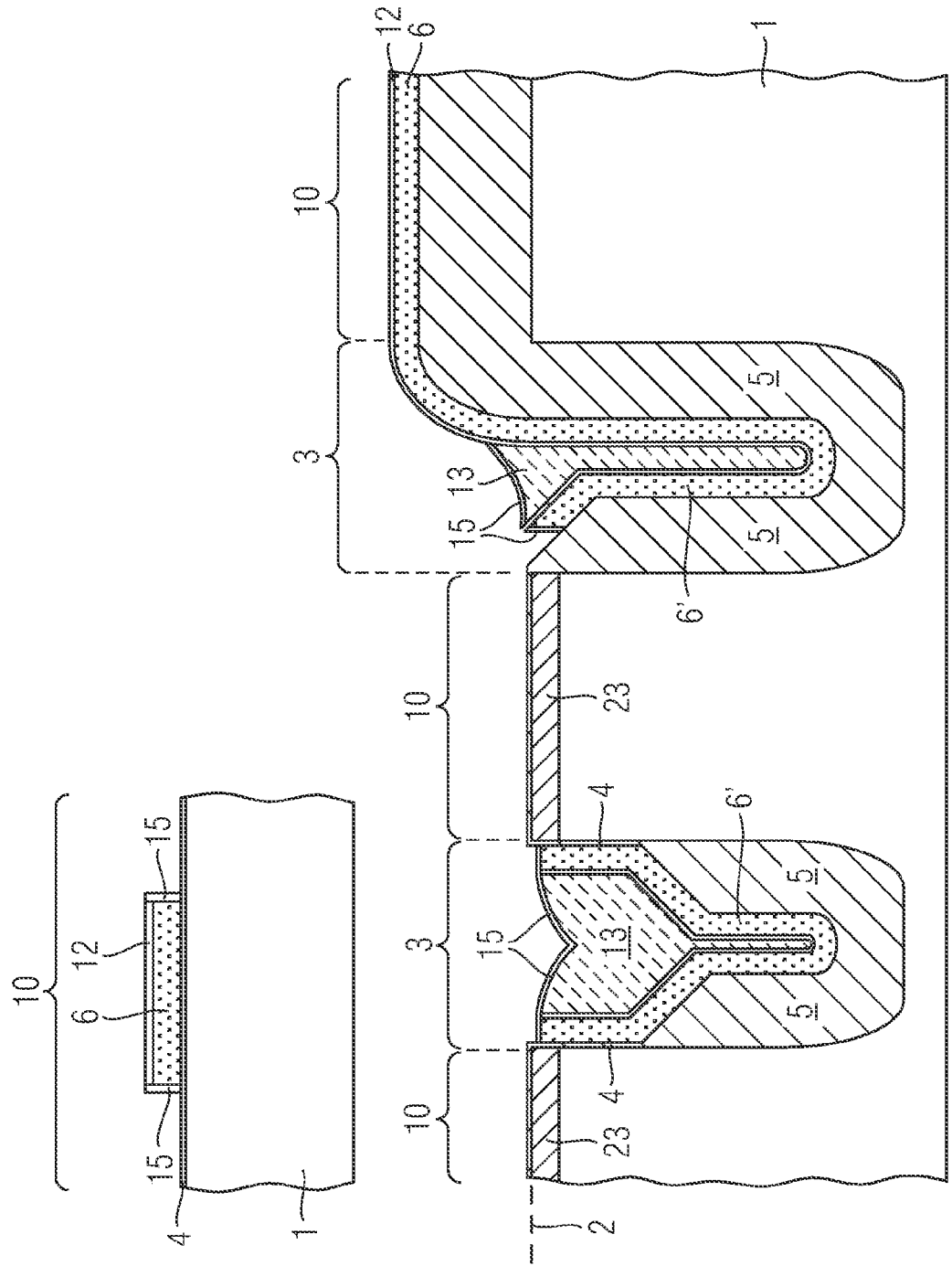

In the schematic cross-sectional view illustrated in FIG. 14, a reoxidation of uncovered regions of the semiconductor structure 6 and also of the filling structure 13 within the trenches 3 was carried out in order to effect covering with an oxide layer 15. The oxide layer 15 likewise covers sidewalls of the semiconductor structure 6—serving as a gate electrode—of the partial FIG. of the planar MOSFET to be formed as illustrated in the top left region of FIG. 14.

Figure 15:
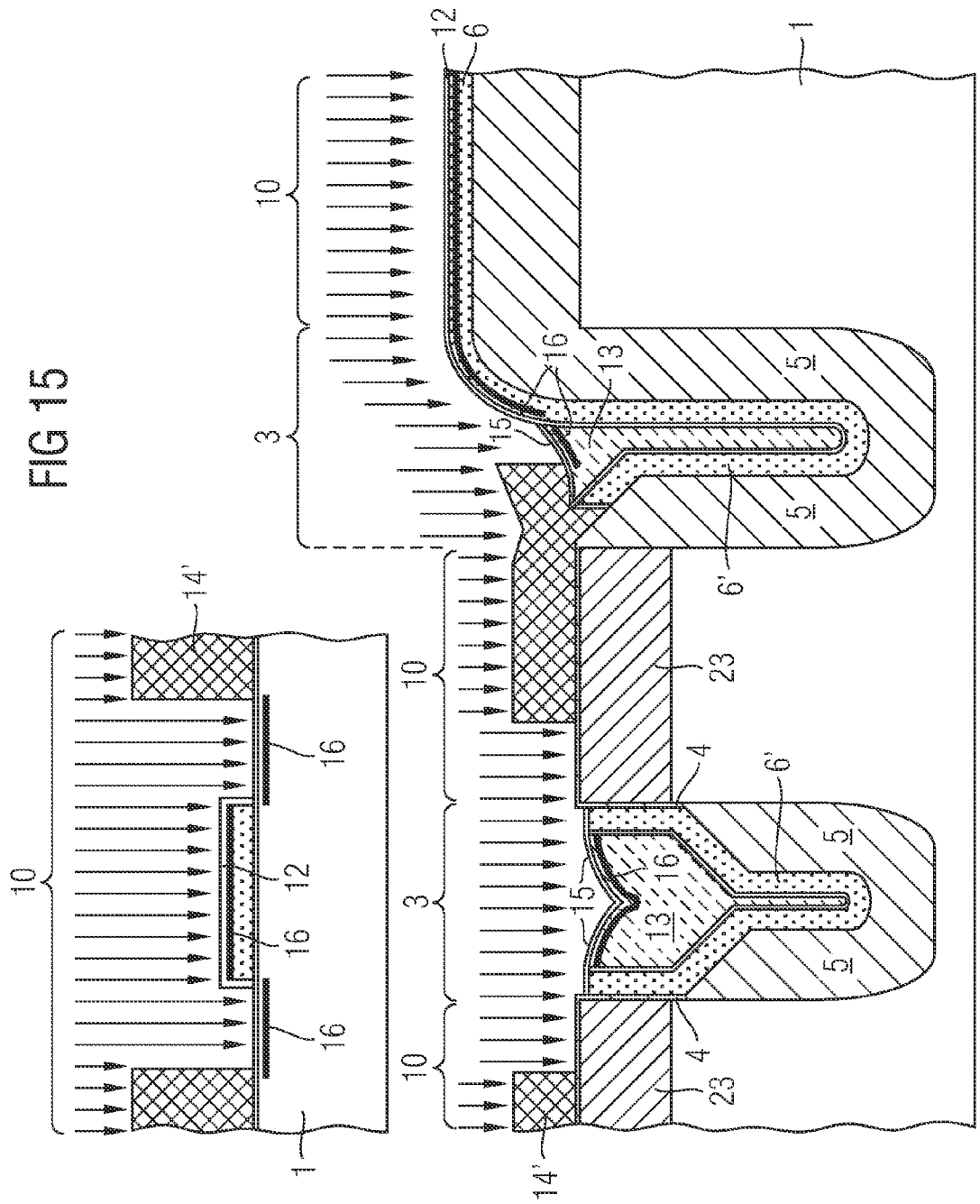

The schematic cross-sectional view in FIG. 15 illustrates a process stage subsequent to FIG. 14 in a method according to the invention for fabricating a semiconductor structure having selective dopant regions. A patterned further resist layer 14' serves for forming source areas in the trench transistor and also source and drain areas of the planar MOSFET illustrated in the top left region in the partial figure. Arrows identify an implantation direction for introducing dopants into the semiconductor substrate 1. On account of the hard mask structure 12 above the semiconductor structure 6—serving as a gate electrode—of the planar MOSFET illustrated in the top left part of the figure sheet and also above the semiconductor structure 6 in the planar region 10—covered with the hard mask structure 12—of the edge termination area of the trench transistor structure, the implantation is not effected through the semiconductor structure 6 into the substrate 1, but rather ends in the semiconductor structure 6. Consequently, dopants can be added to parts of the semiconductor structure 6 in the planar regions 10 by means of implantation process, cf., for instance, the implanted regions 16 in FIG. 15, so that both the dopant concentration and thus the layer conductivity of corresponding parts of the semiconductor structure 6 and the conductivity type can be established in a manner dependent on the available implantations.

Figure 16:
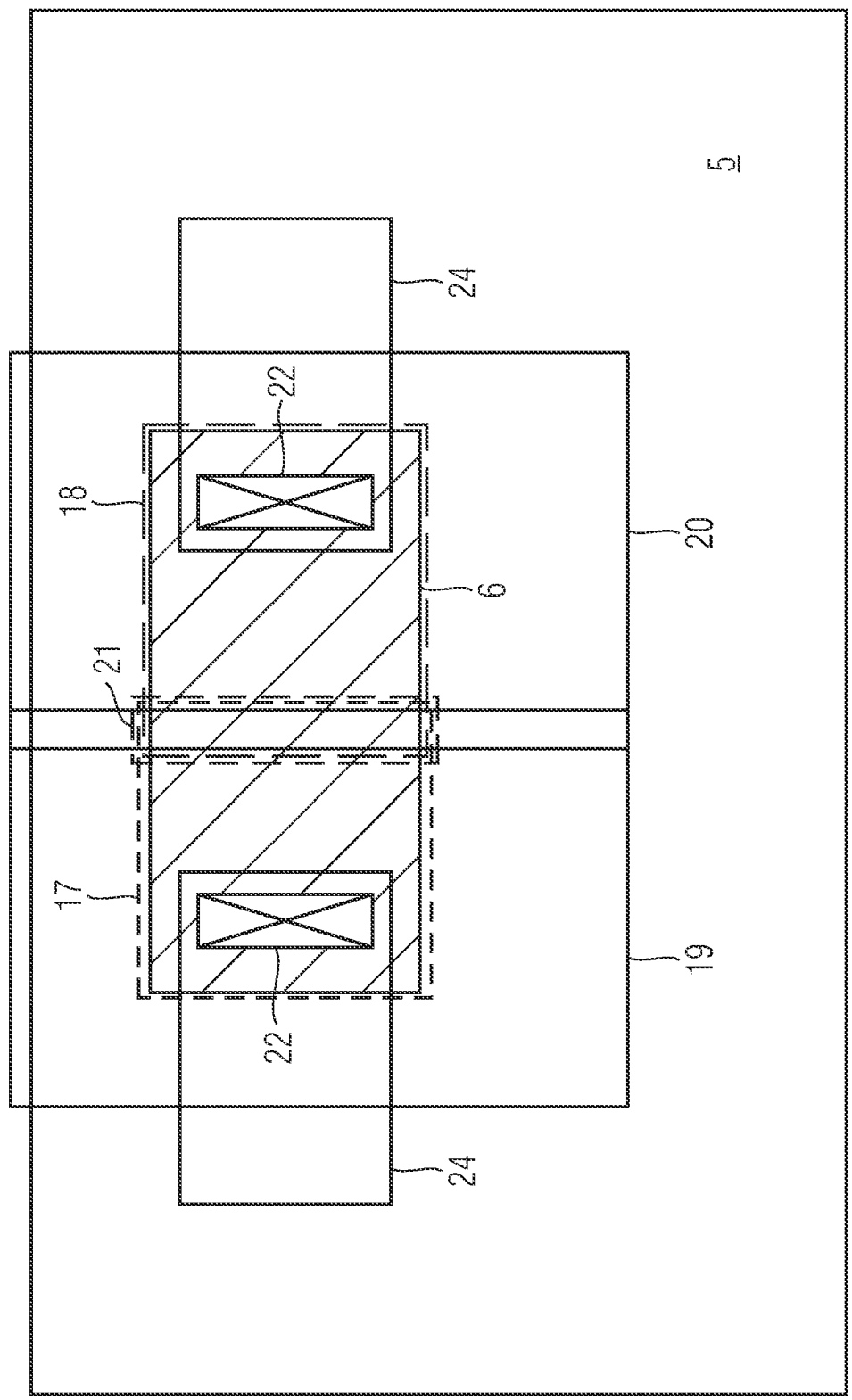
FIGS. 16 to 18 illustrate schematic plan views of diodes according to various embodiments of the invention.

FIG. 16 illustrates a schematic plan view of a first embodiment of a diode fabricated from the semiconductor structure 6 in accordance with the invention. The rectangles illustrated identify areas formed by means of corresponding masks. The semiconductor structure 6 is formed on the field oxide structure 5. Dopants of the n conductivity type are added to the semiconductor structure 6 in a first region 17 by means of a mask for $n^+$-type implantation 19. Dopants of the p conductivity type are likewise added to the semiconductor structure 6 in a second partial region 18 by means of a mask for $p^+$-type implantation 20. The first partial region 17 and the second partial region 18 overlap in an overlap region 21. The pn junction of the diode of the semiconductor structure 6 that is formed by means of the first partial region 17 and also the second partial region 18 lies in the overlap region 21. The diode illustrated in FIG. 16 is a diode having a low breakdown voltage, since a high dopant concentration was added both to the first partial region 17 and the second partial region 18 by means of the corresponding $n^+$-type implantation and $p^+$-type implantation. Outside the overlap region 21, contacts 22 respectively lie on the first partial region 17 and the second partial region 18 of the semiconductor structure 6. The first partial region 17 and also the second partial region 18 are respectively connected to a metalization layer 24 via the contacts 22. The metalization layer 24 serves for interconnecting the diode just described with further circuit elements of an integrated circuit.

Figure 17:
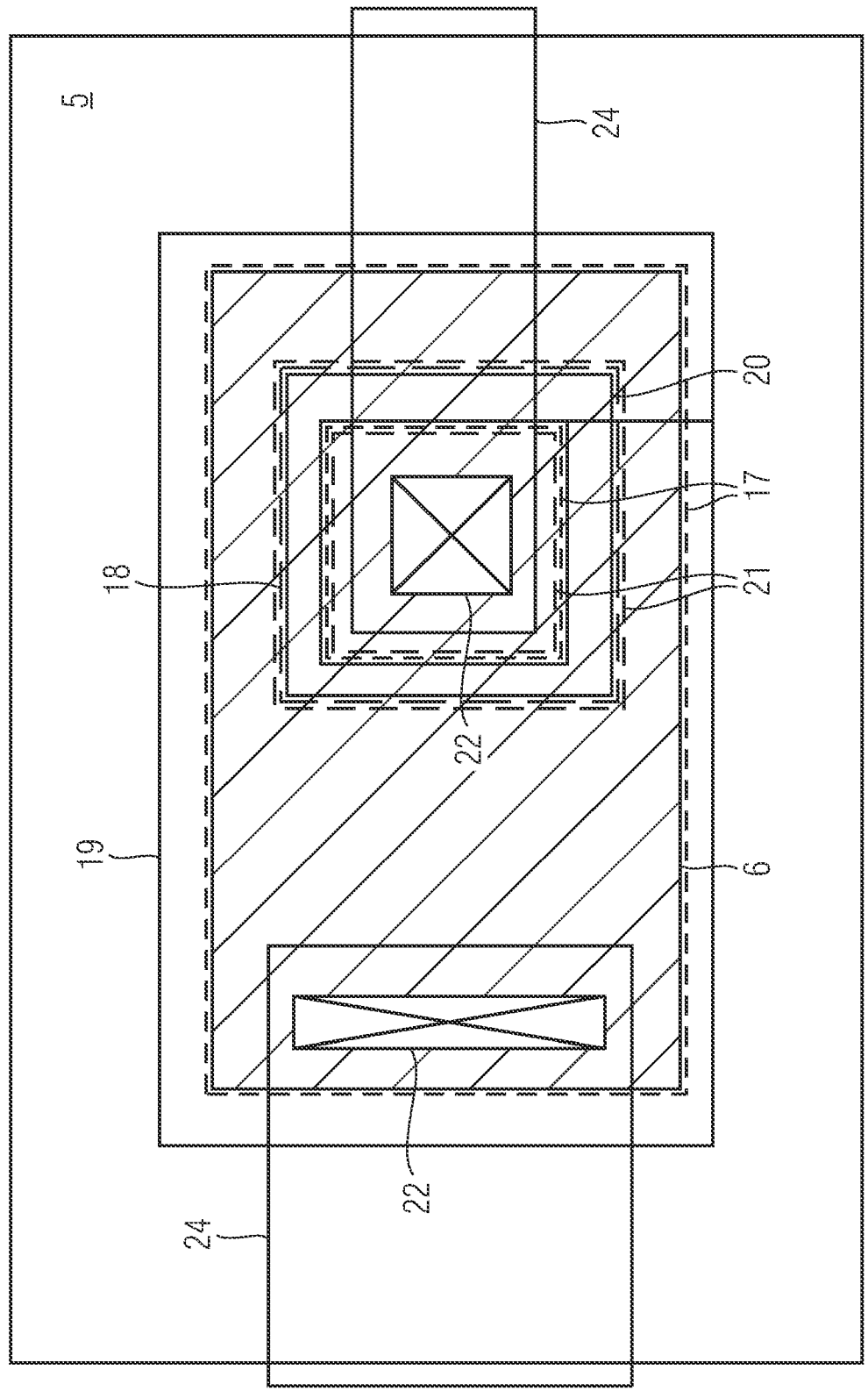

FIG. 17 illustrates a schematic plan view of a second embodiment of a diode with the semiconductor structure 6 fabricated in accordance with the invention. In this case, the semiconductor structure 6 is formed as in the case of the first embodiment of the diode on the field oxide structure 5. The first region 17 for forming the cathode has a cut-out region of the semiconductor structure 6. The second partial region 18 is formed both within the cut-out region just mentioned and in an overlap region 21 overlapping the first partial region 17. The doping in the first partial region 17 and also in the second partial region 18 is effected in a manner corresponding to the first embodiment by means of a mask for $n^+$-type implantation 19 and by means of a mask for $p^+$-type implantation 20. The pn junction lies within the overlap region 21. The contact 22 (right-hand contact) is positioned in the center of the second partial region 18 serving as an anode. A further contact 22 is likewise situated in an edge area of the first partial region 17 (left-hand contact). Both contacts are respectively connected via metalization layers 24.

Figure 18:
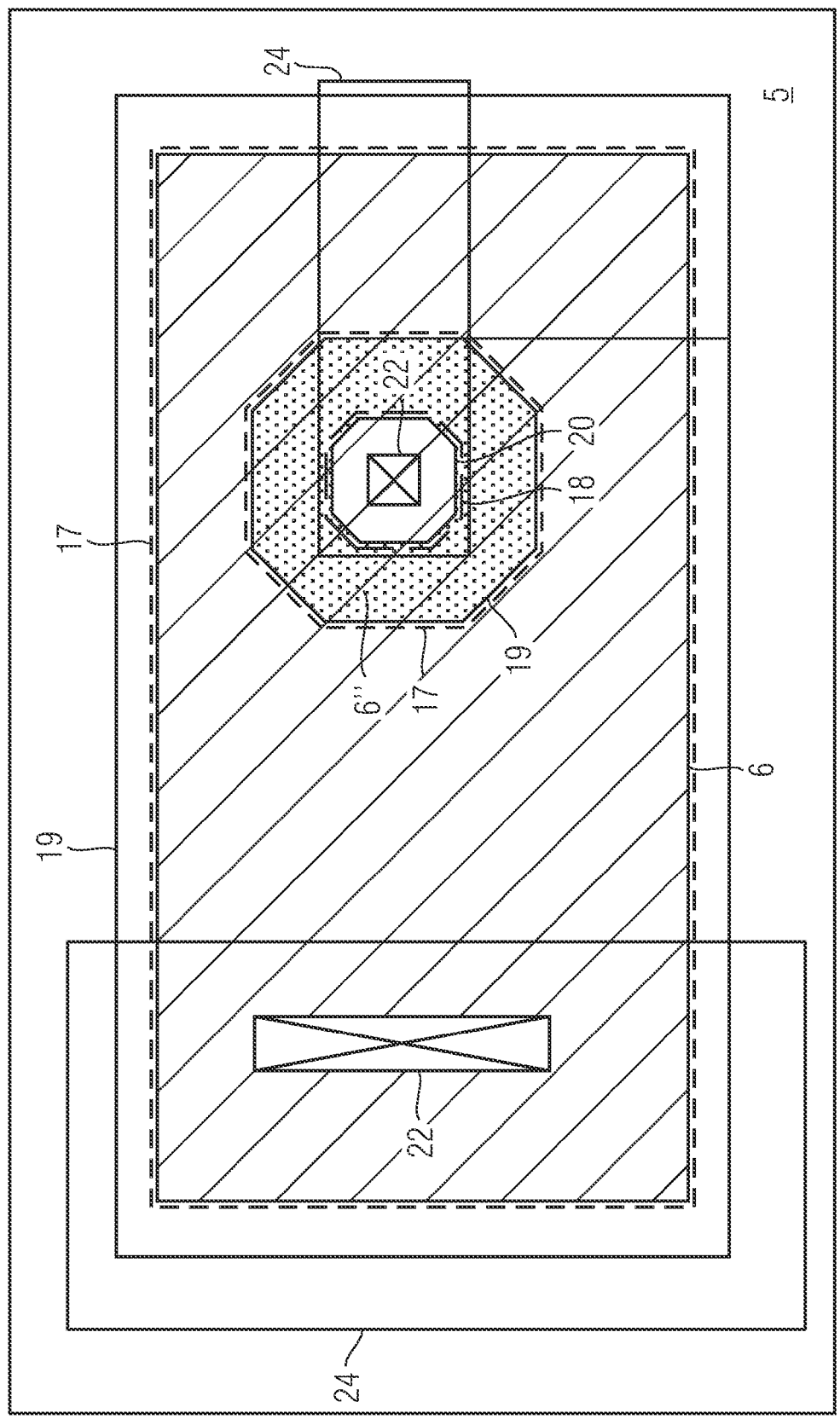

FIG. 18 illustrates a plan view of a further embodiment of a diode based on a semiconductor structure 6 fabricated in accordance with the invention. The semiconductor structure 6 is applied on a field oxide structure 5 in a manner corresponding to the diodes of the first and second embodiments as illustrated in FIGS. 16 and 17. In contrast to the diodes from FIGS. 16 and 17, the first partial region 17 and the second partial region 18 of this further embodiment do not form an overlap region. However, the first partial region 17 and the second partial region 18 are separated from one another by an undoped region 6" of the semiconductor structure 6. Dopants of the n conductivity type are implanted into the first partial region 17 after patterning by means of the mask for $n^+$-type implantation 19. Dopants of the p conductivity type are likewise implanted into the second partial region 18 by means of the mask for $p^+$-type implantation 20. Firstly, the undoped region 6" is depleted of free, intrinsic charge carriers by depletion of the undoped region 6" upon application of a reverse voltage between anode (second partial region 18) and cathode (first partial region 17). In this case, a high reverse voltage is dropped across the undoped region 6", so that the diode of this further embodiment is a diode having a high reverse voltage in comparison with the diodes illustrated in FIGS. 16 and 17. The diode is driven in the manner already described in the previous first and second embodiments with the aid of the metalization layers 24, which make contact with anode and cathode via contact holes 22.

Figure 19:
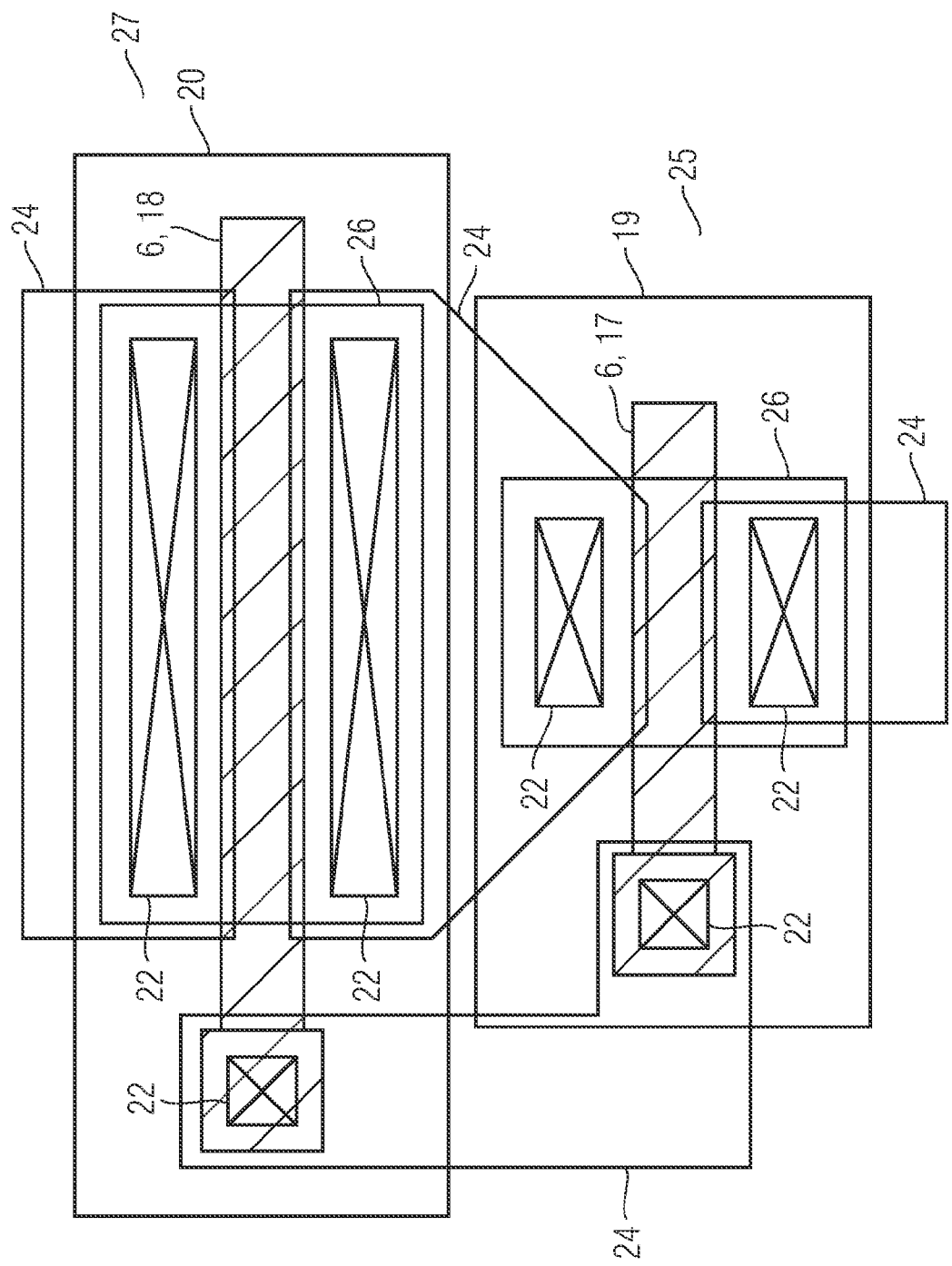
FIG. 19 illustrates a schematic plan view of an inverter with the semiconductor structure fabricated according to the invention.

FIG. 19 illustrates a schematic plan view of an inverter structure with a semiconductor structure fabricated in accordance with the invention as a gate electrode. The n-channel MOSFET 25 of the inverter structure, illustrated in the lower part, has an active area 26, above which the semiconductor structure 6 is formed as a gate electrode structure over a gate oxide structure (not illustrated). Source and drain of the n-channel MOSFET 25 adjoining the semiconductor structure 6, the source and drain being correspondingly formed with dopants of the n conductivity type by means of the mask for $n^+$-type implantation 19. Following this implantation, dopants are also introduced into the first partial region 17 of the semiconductor structure 6 forming the gate electrode structure of the n-channel MOSFET. Consequently, the semiconductor structure 6 is doped with dopants of the n conductivity type in the first partial region 17. A p-channel MOSFET 27 of the inverter structure is schematically outlined in the upper part of the illustration. A semiconductor structure 6 serving as a gate electrode structure lies above the active area 26 assigned to the p-channel MOSFET 27. Dopants of the p conductivity type are correspondingly added to the source and drain of the p-channel MOSFET 27 via the mask for $p^+$-type implantation. During this implantation, dopants of the p conductivity type are likewise added to the second partial region 18 of the semiconductor structure 6, so that it has a different conductivity from the first partial region 17. First partial region 17 and second partial region 18, acting as gate electrodes of the n-channel MOSFET 25 and of the p-channel MOSFET 27, are short-circuited via contacts 22 and the metalization layer 24. Contacts 22 likewise serve for connecting the source and drain areas of the n-channel MOSFET 25 and p-channel MOSFET 27 to metalization layers 24 for interconnecting the transistors to form the inverter.

Figure 20:
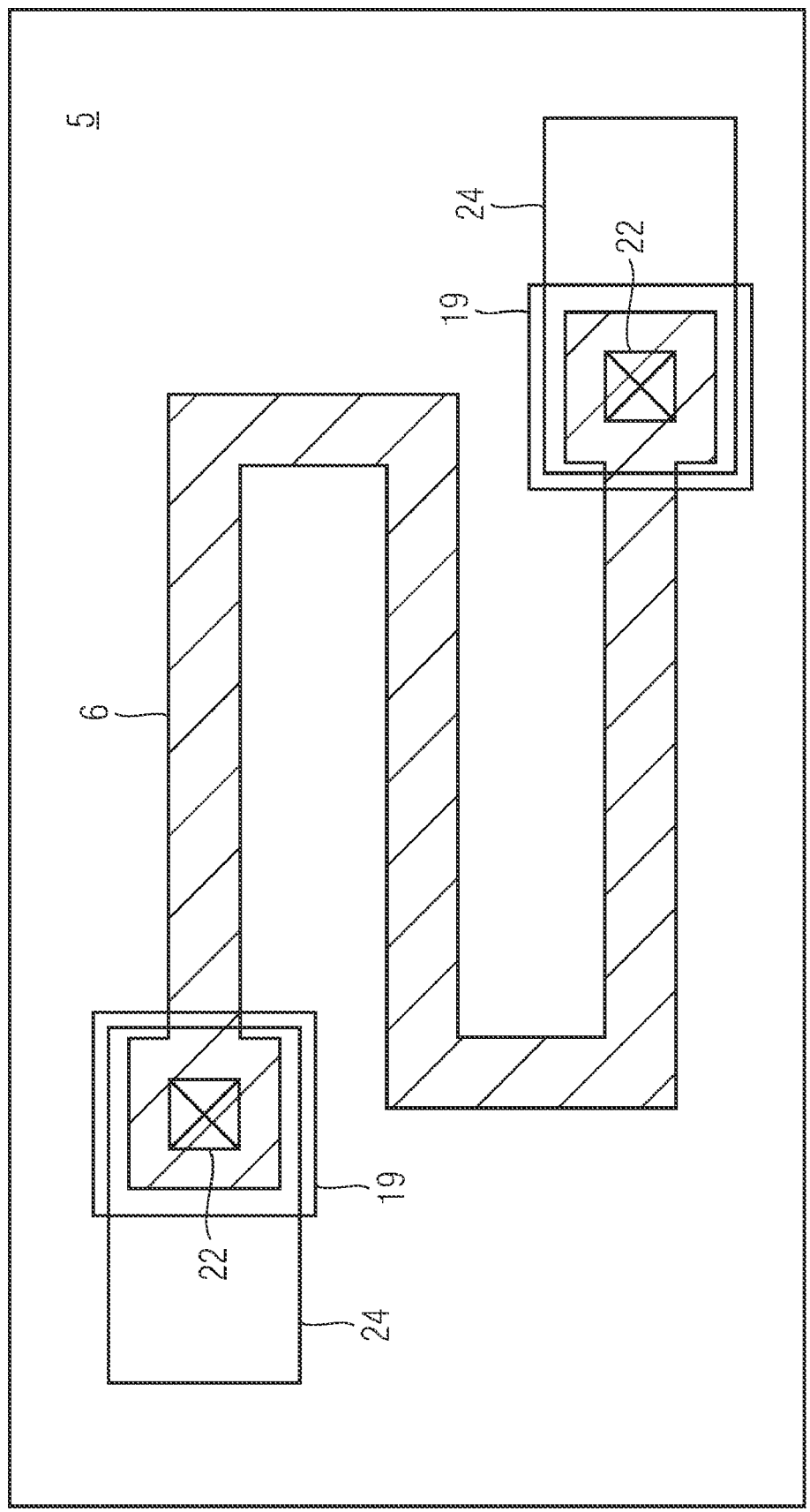
FIGS. 20 and 21 illustrate schematic plan views of resistors fabricated in accordance with one embodiment of the invention.

FIG. 20 illustrates a schematic plan view of a resistor based on a semiconductor structure 6 fabricated according to the method according to the invention. The semiconductor structure 6 made of polysilicon forms a meandering structure and is undoped. The semiconductor structure 6 lies above the field oxide structure 5 and has a very low layer conductivity. Contact is made with the resistor with the aid of connection areas at the two ends of the meandering structure, which is formed by means of the mask for $n^+$-type implantation 19 with a high concentration of dopants of the n conductivity type for the purpose of obtaining a lowest possible contact resistance with respect to the contacts 22. Metalization layers 24 serve for interconnecting the resistor with further components of a circuit.

Figure 21:
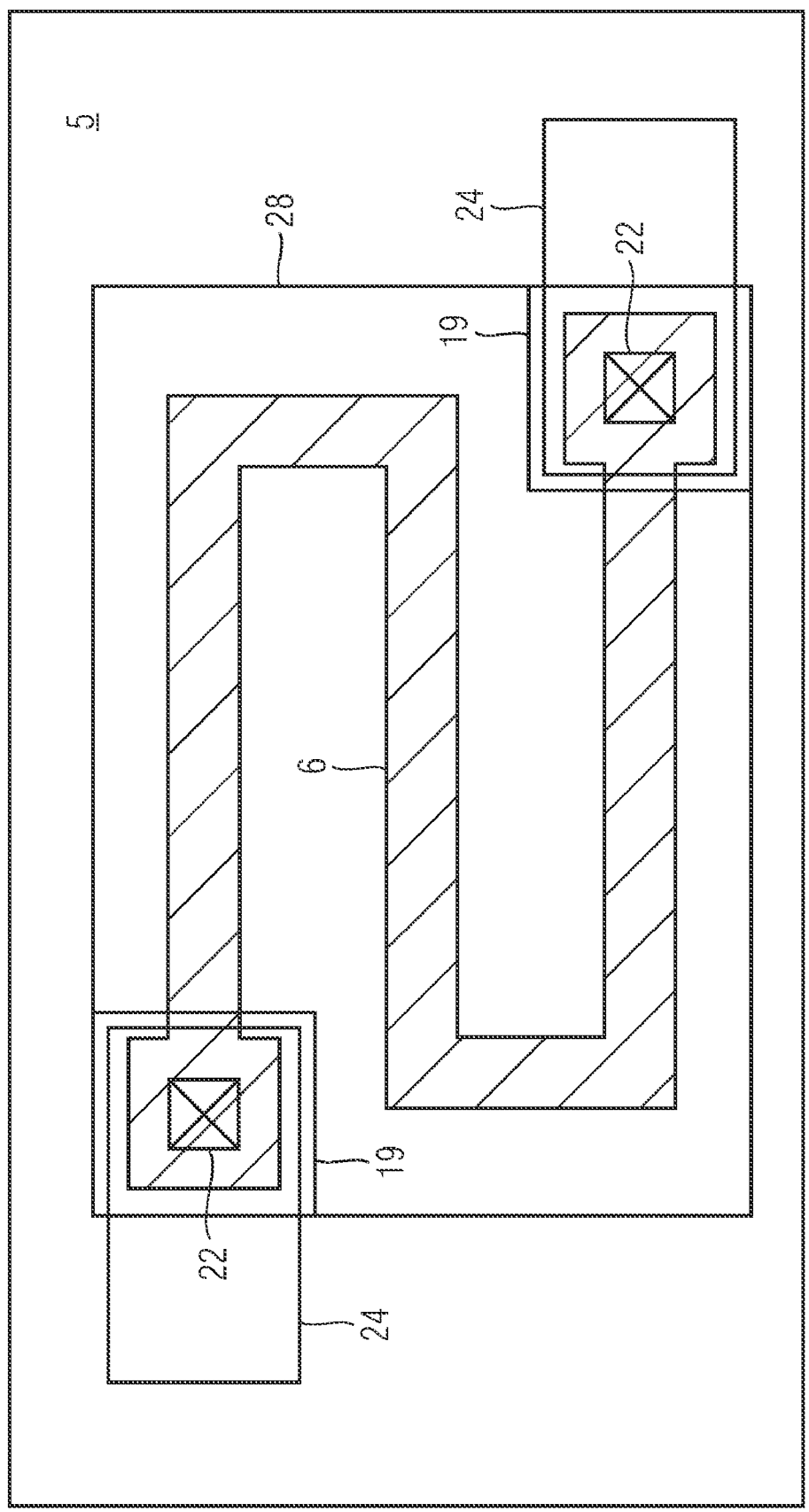

FIG. 21 illustrates a schematic view of an embodiment of a further resistor, which is likewise formed by means of a semiconductor structure 6 fabricated according to the method according to the invention. In contrast to the embodiment of the resistor in FIG. 20, dopants of the n conductivity type are added to the semiconductor structure 6 of this embodiment by means of a mask for n implantation 28 and the semiconductor structure 6 thus has a higher conductivity compared with the undoped semiconductor structure 6 illustrated in FIG. 20. It should be taken into consideration that the dopant concentration of the semiconductor structure 6, stemming from the implantation by means of the mask 28, is lower than a concentration brought about by means of the implantation through the mask 19. Consequently, the semiconductor structure 6 of this embodiment is suitable for forming resistors of medium layer conductivity, which are also referred to as medium ohm poly.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for fabricating a semiconductor structure having selective dopant regions, comprising in the following order:

providing a semiconductor substrate having trenches and a semiconductor substrate surface;

producing a semiconductor structure covering the semiconductor substrate surface, sidewalls and bottom regions within the trenches;

producing an auxiliary structure serving as a dopant source and covering the semiconductor structure;

thermally induced introduction of dopants from the auxiliary structure into those parts of the semiconductor structure which are formed within the trenches;

patterning the semiconductor structure; and introducing dopants of a first conductivity type into first partial regions of the semiconductor structure and dopants of a second conductivity type, which is opposite to the first conductivity type, into second partial regions of the semiconductor structure via a non-masked surface.

2. The method as claimed in claim 1, comprising forming the semiconductor structure from undoped polysilicon.

3. The method as claimed in claim 1, comprising introducing dopants of the first conductivity type at least into the first partial regions of the semiconductor structure by one or more dopant implantation process, the dopant implantation process being provided for forming well zones of the first conductivity type in an active area of the semiconductor substrate; and introducing dopants of the second conductivity type at least into the second partial regions of the semiconductor structure by means of one or more further dopant implantation process, the further dopant implantation process being provided for forming well zones of the second conductivity type in an active area of the semiconductor substrate.

4. The method as claimed in claim 1, comprising forming parts of the first partial regions in a manner overlapping parts of the second partial regions.

5. The method as claimed in claim 1, comprising providing mutually adjoining and/or mutually overlapping first and second partial regions for forming diodes.

6. The method as claimed in claim 1, comprising a first partial region and a second partial region of the semiconductor structure, which are remote from one another by virtue of an intervening undoped region of the semiconductor structure, for forming diodes having a breakdown voltage of greater than 10 V.

7. The method as claimed in claim 1, wherein within the first and/or second partial regions, forming areas having different dopant concentrations in order to form resistors having different layer conductivities and/or diodes having different breakdown voltages.

8. The method as claimed in claim 1, wherein the auxiliary structure has a plurality of auxiliary structures arranged one above another.

9. The method as claimed in claim 8, wherein in order to form the auxiliary structure, firstly a first auxiliary structure having an undoped oxide of the silicon is formed and a second auxiliary structure having a mixture of an oxide of the silicon and an oxide of a dopant element is formed on the first auxiliary structure.

10. The method as claimed in claim 1, wherein the second auxiliary structure is produced in the temperature range of 300° C. to 950° C.

11. A method for fabricating a semiconductor structure having selective dopant regions, comprising in the following order:

providing a semiconductor substrate having trenches which are formed therein and reach a semiconductor substrate surface;

producing a semiconductor structure covering the semiconductor substrate surface, sidewalls and bottom regions within the trenches;

producing an auxiliary structure serving as a dopant source and covering the semiconductor structure;

removing parts of the auxiliary structure formed above the semiconductor substrate surface;

producing a covering structure on uncovered regions of the semiconductor structure and the auxiliary structure;

thermally induced introduction of dopants from the auxiliary structure into those parts of the semiconductor structure which are formed within the trenches;

removing the covering structure and the auxiliary structure and producing a hard mask structure covering the semiconductor structure;

producing a filling structure filling the trenches;

producing a resist layer on an uncovered surface and opening parts of the resist layer for patterning the semiconductor structure;

patterning the semiconductor structure; and introducing dopants of a first conductivity type into first partial regions of the semiconductor structure and dopants of a second conductivity type, which is opposite to the first conductivity type, into second partial regions of the semiconductor structure via an uncovered surface.

12. The method as claimed in claim 11, comprising forming the semiconductor structure from undoped polysilicon.

13. The method as claimed in claim 11, wherein dopants of the first conductivity type are introduced at least into the first partial regions of the semiconductor structure by means of one or more dopant implantation process, the dopant implantation process being provided for forming well zones of the first conductivity type in an active area of the semiconductor substrate; and dopants of the second conductivity type are introduced at least into the second partial regions of the semiconductor structure by means of one or more further dopant implantation process, the further dopant implantation process being provided for forming well zones of the second conductivity type in an active area of the semiconductor substrate.

14. The method as claimed in claim 11, wherein parts of the first partial regions are formed in a manner overlapping parts of the second partial regions.

15. The method as claimed in claim 11, wherein mutually adjoining and/or mutually overlapping first and second partial regions are provided for forming diodes.

16. The method as claimed in claim 11, wherein a first partial region and a second partial region of the semiconductor structure, which are remote from one another by virtue of an intervening undoped region of the semiconductor structure, are provided for forming diodes having a breakdown voltage of greater than 10 V.

17. The method as claimed in claim 11, wherein within the first and/or second partial regions, areas having different dopant concentrations are formed in order to form resistors having different layer conductivities and/or diodes having different breakdown voltages.

18. The method as claimed in claim 11, wherein the auxiliary structure has a plurality of auxiliary structures arranged one above another.

19. The method as claimed in claim 18, wherein in order to form the auxiliary structure, firstly a first auxiliary structure having an undoped oxide of the silicon is formed and a second auxiliary structure having a mixture of an oxide of the silicon and an oxide of a dopant element is formed on the first auxiliary structure.

20. The method as claimed in claim 19, wherein a second auxiliary structure is produced in the temperature range of 300° C. to 950° C.

* * * * *